(12) United States Patent
Myung et al.

(10) Patent No.: US 12,660,169 B2
(45) Date of Patent: Jun. 16, 2026

(54) INTEGRATED CIRCUIT DEVICE

(71) Applicant: SAMSUNG ELECTRONICS CO., LTD., Suwon-si (KR)

(72) Inventors: Miso Myung, Suwon-si (KR); Keunnam Kim, Yongin-si (KR); Euna Kim, Seoul (KR); Huijung Kim, Seongnam-si (KR); Sangho Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 527 days.

(21) Appl. No.: 18/107,589

(22) Filed: Feb. 9, 2023

(65) Prior Publication Data

US 2023/0262962 A1    Aug. 17, 2023

(30) Foreign Application Priority Data

Feb. 14, 2022    (KR) ........................ 10-2022-0019098

(51) Int. Cl.
H10B 12/00    (2023.01)

(52) U.S. Cl.
CPC ........... H10B 12/482 (2023.02); H10B 12/02 (2023.02); H10B 12/315 (2023.02); H10B 12/34 (2023.02)

(58) Field of Classification Search
CPC ..... H10B 12/482; H10B 12/315; H10B 12/02
See application file for complete search history.

(56) References Cited

U.S. PATENT DOCUMENTS

| | | | |
|---|---|---|---|
| 8,999,837 B2 | 4/2015 | Park et al. | |
| 10,008,505 B2 | 6/2018 | Lee et al. | |
| 10,923,480 B2 | 2/2021 | Surthi et al. | |
| 11,121,134 B2 * | 9/2021 | Lee | ...................... H10B 12/485 |
| 2020/0203347 A1 * | 6/2020 | Song | .................... H10B 12/485 |
| 2020/0203354 A1 | 6/2020 | Lee et al. | |
| 2020/0411318 A1 | 12/2020 | Lee et al. | |
| 2021/0066304 A1 | 3/2021 | Kang et al. | |
| 2021/0125998 A1 * | 4/2021 | Kim | ...................... H10B 12/05 |
| 2021/0335790 A1 * | 10/2021 | Song | .................... H10B 12/315 |

FOREIGN PATENT DOCUMENTS

| | | | |
|---|---|---|---|
| KR | 10-2017-043683 A | 4/2017 | |
| KR | 1020180017902 A | 2/2018 | |
| KR | 1020210014018 A | 2/2021 | |
| TW | 202011517 A | 3/2020 | |

OTHER PUBLICATIONS

First Office Action dated Aug. 21, 2024, issued from the Taiwanese Patent Office, for corresponding TW Patent Application No. 112104790.

* cited by examiner

*Primary Examiner* — Steven M Page
(74) *Attorney, Agent, or Firm* — Muir Patent Law, PLLC

(57) ABSTRACT

An integrated circuit device includes a substrate having an active area, bit line structures on the substrate, the bit line structures including an insulating spacer on each sidewall thereof, a buried contact between the bit line structures, the buried contact being connected to the active area, an insulation capping pattern on each of the bit line structures, a barrier conductive layer covering side surfaces of the insulation capping pattern, and an upper surface and side surfaces of the insulating spacer, and a landing pad electrically connected to the buried contact, the landing pad vertically overlapping one of the bit line structures on the insulation capping pattern and the barrier conductive layer.

20 Claims, 26 Drawing Sheets

FIG.  4

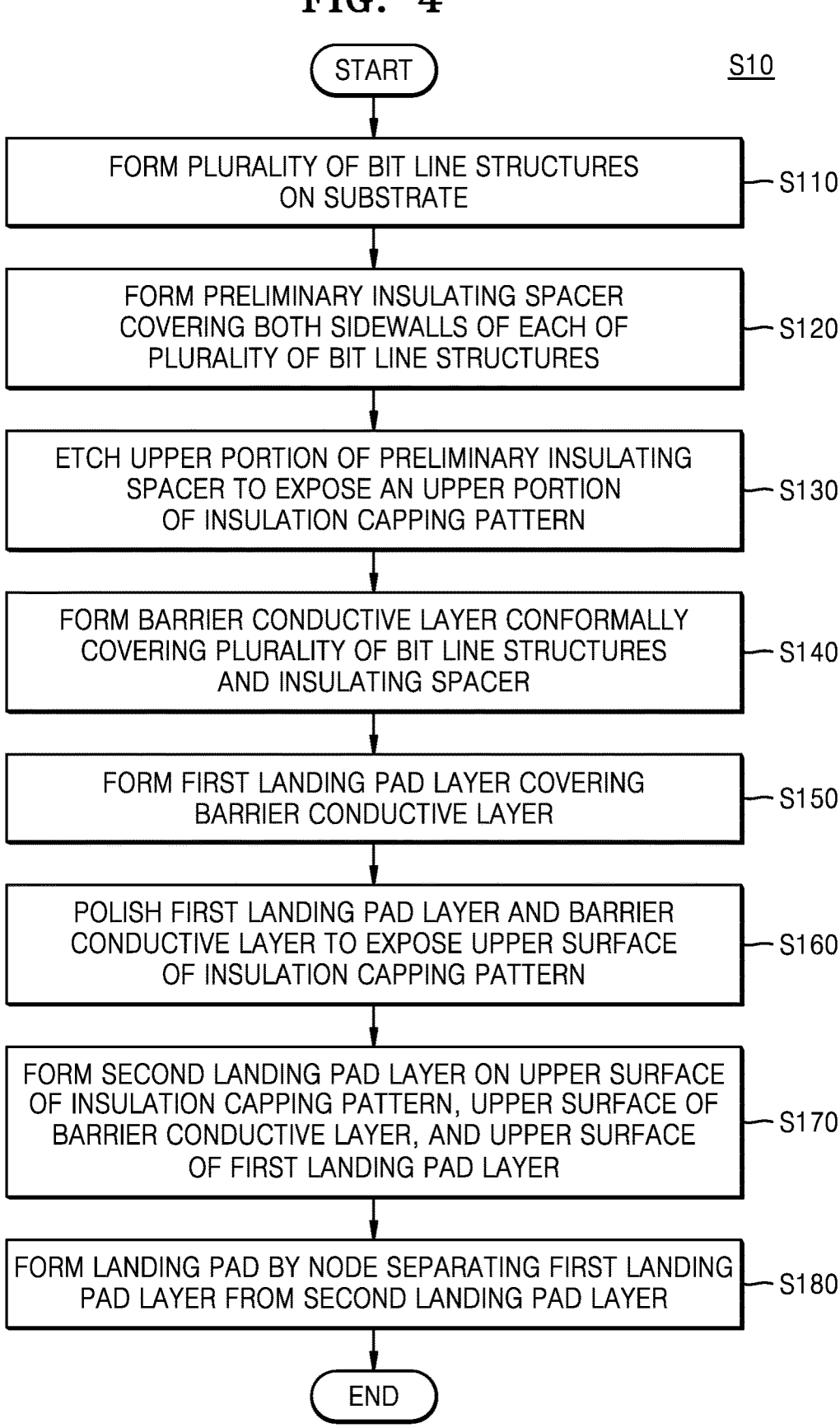

START                                    S10

FORM PLURALITY OF BIT LINE STRUCTURES
ON SUBSTRATE                                    — S110

FORM PRELIMINARY INSULATING SPACER
COVERING BOTH SIDEWALLS OF EACH OF
PLURALITY OF BIT LINE STRUCTURES               — S120

ETCH UPPER PORTION OF PRELIMINARY INSULATING
SPACER TO EXPOSE AN UPPER PORTION
OF INSULATION CAPPING PATTERN                  — S130

FORM BARRIER CONDUCTIVE LAYER CONFORMALLY
COVERING PLURALITY OF BIT LINE STRUCTURES
AND INSULATING SPACER                          — S140

FORM FIRST LANDING PAD LAYER COVERING
BARRIER CONDUCTIVE LAYER                        — S150

POLISH FIRST LANDING PAD LAYER AND BARRIER
CONDUCTIVE LAYER TO EXPOSE UPPER SURFACE
OF INSULATION CAPPING PATTERN                  — S160

FORM SECOND LANDING PAD LAYER ON UPPER SURFACE
OF INSULATION CAPPING PATTERN, UPPER SURFACE OF
BARRIER CONDUCTIVE LAYER, AND UPPER SURFACE
OF FIRST LANDING PAD LAYER                      — S170

FORM LANDING PAD BY NODE SEPARATING FIRST LANDING
PAD LAYER FROM SECOND LANDING PAD LAYER         — S180

END

INTEGRATED CIRCUIT DEVICE

CROSS-REFERENCE TO RELATED APPLICATION

This application is based on and claims priority under 35 U.S.C. § 119 to Korean Patent Application No. 10-2022-0019098, filed on Feb. 14, 2022, in the Korean Intellectual Property Office, the disclosure of which is incorporated by reference herein in its entirety.

BACKGROUND

1. Field

Embodiments relate to an integrated circuit device, and more particularly, to an integrated circuit device including a landing pad.

2. Description of the Related Art

Electronic devices have become more compact and lighter according to rapid development of the electronics industry and demands of users. Accordingly, integrated circuit devices having a high degree of integration used in the electronic devices are required, and design rules for members of the integrated circuit devices are continuously reduced. Accordingly, the degree of difficulty of a manufacturing process for forming regular conductive patterns constituting the integrated circuit devices and insulating patterns around the regular conductive patterns is gradually increasing.

SUMMARY

According to an aspect of embodiments, there is provided an integrated circuit device including a substrate having an active area; a plurality of bit line structures formed on the substrate, and including an insulating spacer on each sidewall thereof; a buried contact formed between the plurality of bit line structures, and connected to the active area; an insulation capping pattern formed on each of the plurality of bit line structures; a barrier conductive layer arranged to cover side surfaces of the insulation capping pattern, and an upper surface and side surfaces of the insulating spacer; and a landing pad electrically connected to the buried contact, and arranged to vertically overlap one bit line structure among the plurality of bit line structures on the insulation capping pattern and the barrier conductive layer.

According to another aspect of embodiments, there is provided an integrated circuit device including a substrate including a cell area and a core/periphery area; a plurality of bit line structures formed on the cell area, and including an insulating spacer on each sidewall thereof; a buried contact formed between the plurality of bit line structures; an insulation capping pattern formed on each of the plurality of bit line structures; a barrier conductive layer arranged to cover side surfaces of the insulation capping pattern, and an upper surface and side surfaces of the insulating spacer; a landing pad electrically connected to the buried contact, and arranged to vertically overlap one bit line structure among the plurality of bit line structures on the insulation capping pattern and the barrier conductive layer; and a core structure formed on the core/periphery area, and including a barrier metal layer on sidewalls thereof, wherein a vertical level of an uppermost surface of the insulation capping pattern is substantially identical to a vertical level of an uppermost surface of the barrier conductive layer, and a vertical level of an uppermost surface of the core structure is substantially identical to a vertical level of an uppermost surface of the barrier conductive layer.

According to another aspect of embodiments, there is provided an integrated circuit device including a substrate having an active area defined by a device isolation area; a pair of bit line structures formed on the substrate, and including an insulating spacer on sidewalls of each of the pair of bit line structures; a buried contact formed between the pair of bit line structures, and connected to the active area; an insulation capping pattern formed on each of the pair of bit line structures; a barrier conductive layer arranged to cover side surfaces of the insulation capping pattern, and an upper surface and side surfaces of the insulating spacer; a landing pad electrically connected to the buried contact, and arranged to vertically overlap one of the pair of bit line structures on the insulation capping pattern and the barrier conductive layer; a node separation pattern contacting one side surface of the insulation capping pattern of the other of the pair of bit line structures, and contacting an upper surface of the insulating spacer arranged on an identical side surface to one side surface of the insulation capping pattern; and a capacitor structure formed on an upper surface of the landing pad, and including a capacitor lower electrode electrically connected to the landing pad.

BRIEF DESCRIPTION OF THE DRAWINGS

Features will become apparent to those of skill in the art by describing in detail exemplary embodiments with reference to the attached drawings, in which:

FIG. 4 is a flowchart of a manufacturing method of an integrated circuit device, according to an embodiment;

FIGS. 5A through 13A are cross-sectional views along line A-A' in FIG. 2 illustrating stages in a manufacturing method of an integrated circuit device according to embodiments;

FIGS. 5B through 13B are cross-sectional views along line B-B' in FIG. 2 illustrating stages in a manufacturing method of an integrated circuit device according to embodiments.

DETAILED DESCRIPTION

Figure 1:
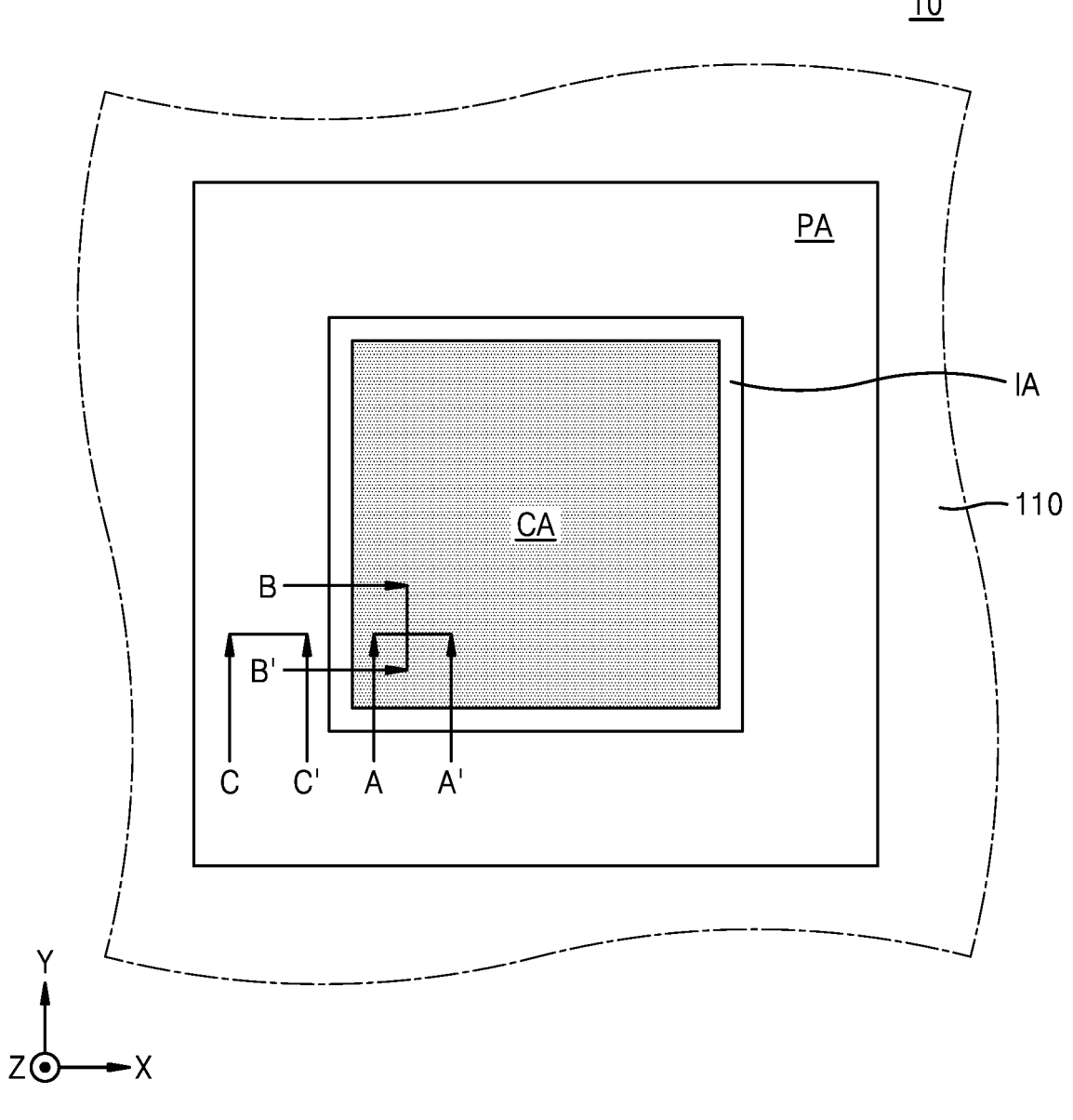
FIG. 1 is a plan view of an integrated circuit device, according to an embodiment.

FIG. 1 is a plan view of a schematic configuration of an integrated circuit device 10, according to an embodiment.

Referring to FIG. 1, the integrated circuit device 10 may include a cell area CA, a core/periphery area PA surrounding the cell area CA, and a substrate 110 including an interface area IA arranged between the cell area CA and the core/periphery area PA. For example, referring to FIG. 1, each of the interface area IA and the core/periphery area PA may surround an entire perimeter of the cell area CA, in a top view, so the interface area IA may completely separate the cell area CA and the core/periphery area PA therebetween.

For example, the substrate 110 may include a wafer including silicon (Si). In another example, the substrate 110 may include a wafer including a semiconductor element, e.g., germanium (Ge), or a compound semiconductor, e.g., at least one of silicon carbide (SiC), gallium arsenide (GaAs), indium arsenide (InAs), and indium phosphide (InP). In yet another example, the substrate 110 may have a silicon on insulator (SOI) structure. In addition, the substrate 110 may include a conductive area, e.g., a well doped with impurities or a structure doped with impurities.

In some embodiments, the cell area CA may include a memory cell area of the integrated circuit device 10. The cell area CA may constitute a memory cell area of a volatile memory element, or a memory cell area of a non-volatile memory element. The memory cell area may include a memory cell area, e.g., dynamic random access memory (DRAM), magnetic random access memory (MRAM), static random access memory (SRAM), phase change random access memory (PRAM), resistance random access memory (RRAM), and ferroelectric random access memory (FRAM). The cell area CA may include a unit memory cell including a transistor and a capacitor, or a unit memory cell including a switching element and a variable resistor.

In the core/periphery area PA, core circuits and periphery circuits required for driving memory cells located in the cell area CA may be arranged. In the interface area IA, a plurality of wiring lines arranged for an electrical connection of the cell area CA to the core/periphery area PA, and a structure for insulation between the cell area CA and the core/periphery area PA may be arranged.

Figure 2:
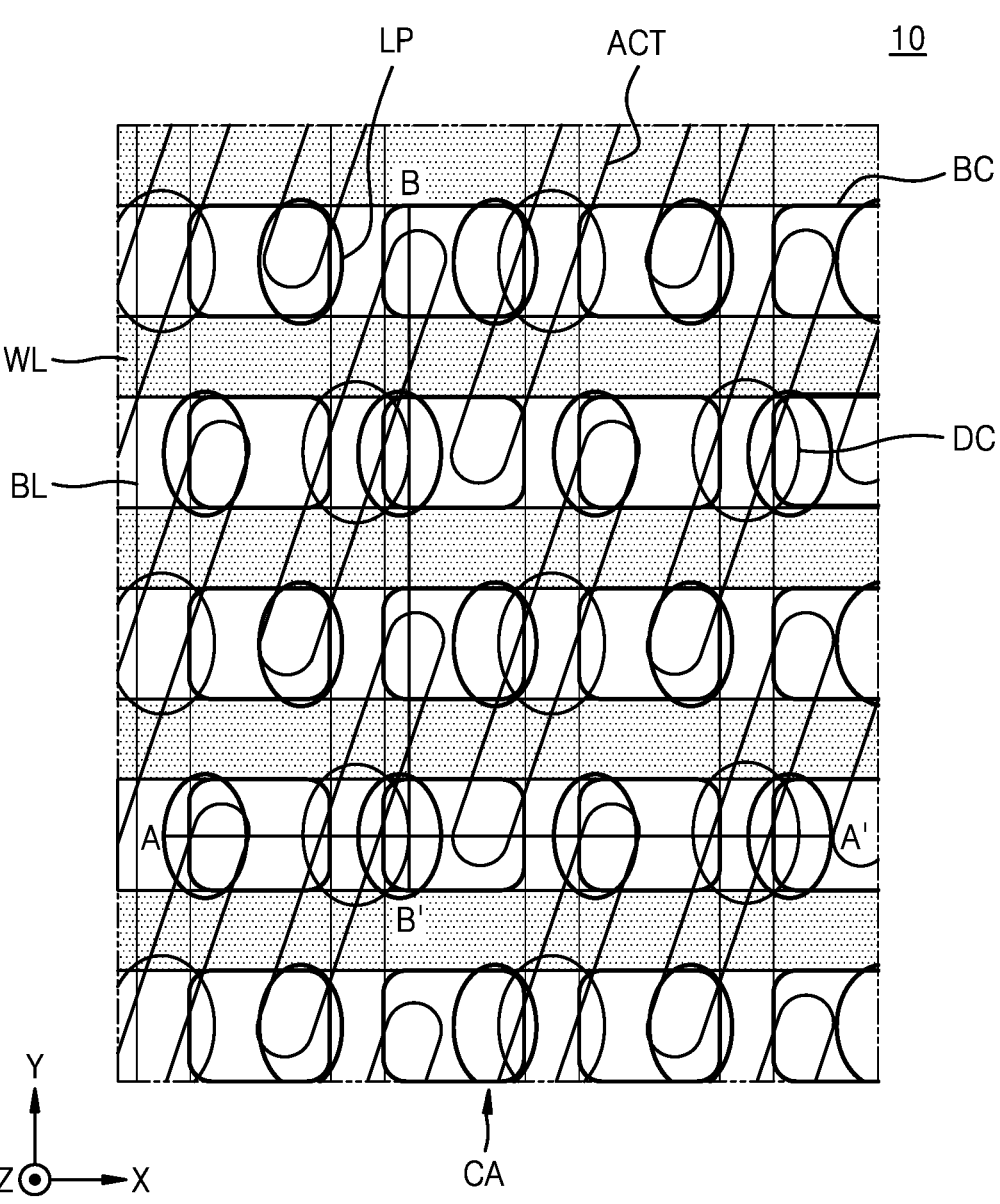
FIG. 2 is a planar layout of main components of cell areas of an integrated circuit device, according to an embodiment.

FIG. 2 is a planar layout of main components of the cell areas CA of the integrated circuit device 10, according to an embodiment.

Referring to FIG. 2, the integrated circuit device 10 may include a plurality of active areas ACT arranged to have a long axis in a diagonal direction with respect to a first horizontal direction (X direction) and a second horizontal direction (Y direction). A plurality of word lines WL may extend in parallel with each other in the first horizontal direction (X direction) across the plurality of active areas ACT. On the plurality of word lines WL, a plurality of bit lines BL may extend in parallel with each other in the second horizontal direction (Y direction) crossing the first horizontal direction (X direction).

The plurality of bit lines BL may be connected to the plurality of active areas ACT via direct contacts DC. In some embodiments, a plurality of buried contacts BC may be formed between two adjacent bit lines BL among the plurality of bit lines BL. Each of the plurality of buried contacts BC may extend on an upper portion of any one of two adjacent bit lines BL. In some embodiments, the plurality of buried contacts BC may be arranged in a line in the first horizontal direction (X direction) and the second horizontal direction (Y direction).

A plurality of landing pads LP may be formed on the plurality of buried contacts BC. The plurality of buried contacts BC and the plurality of landing pads LP may connect lower electrodes of capacitors formed on the plurality of bit lines BL to the plurality of active areas ACT. The plurality of landing pads LP may respectively and partially overlap the plurality of buried contacts BC. Detailed descriptions thereof are given below.

Figure 3A:
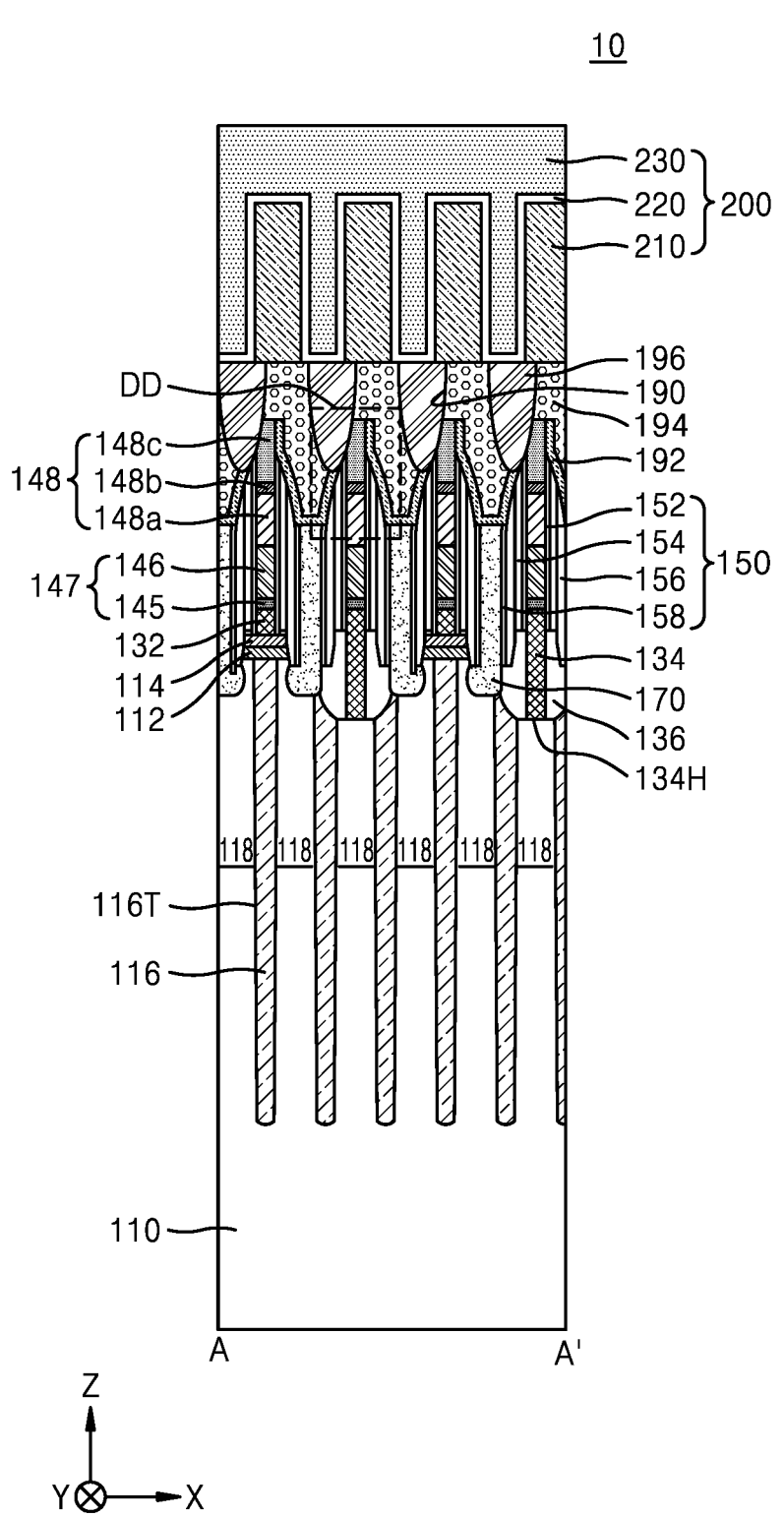
FIGS. 3A through 3D are cross-sectional views of main components of an integrated circuit device, according to embodiments.
Figure 3B:
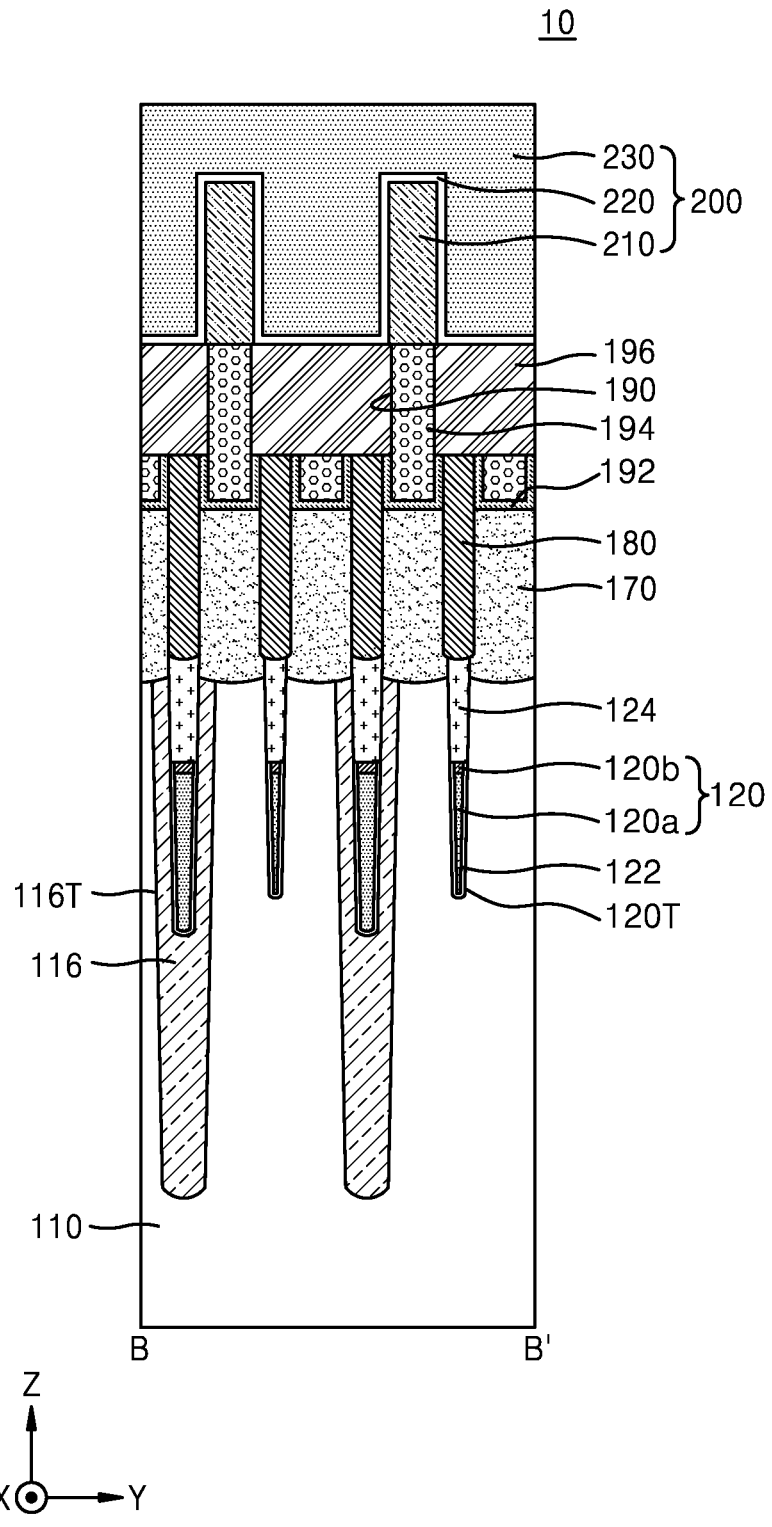
Figure 3C:
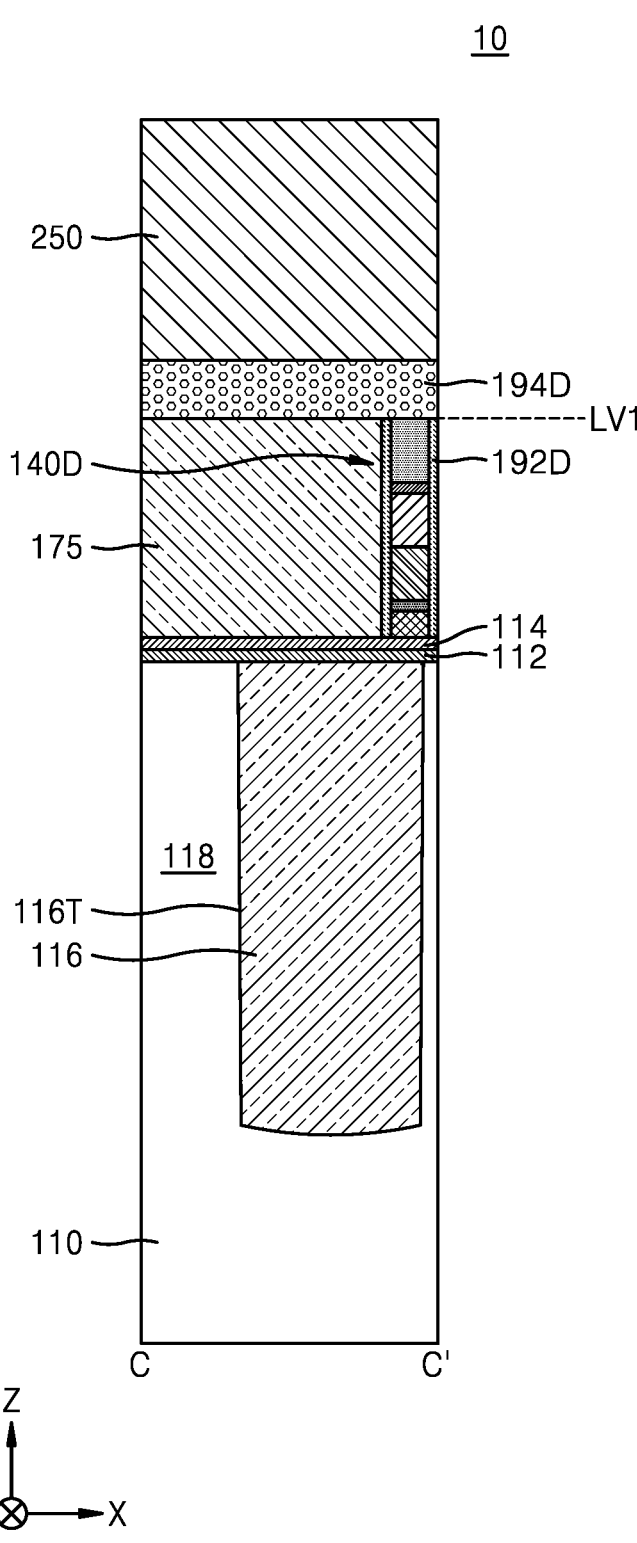
Figure 3D:
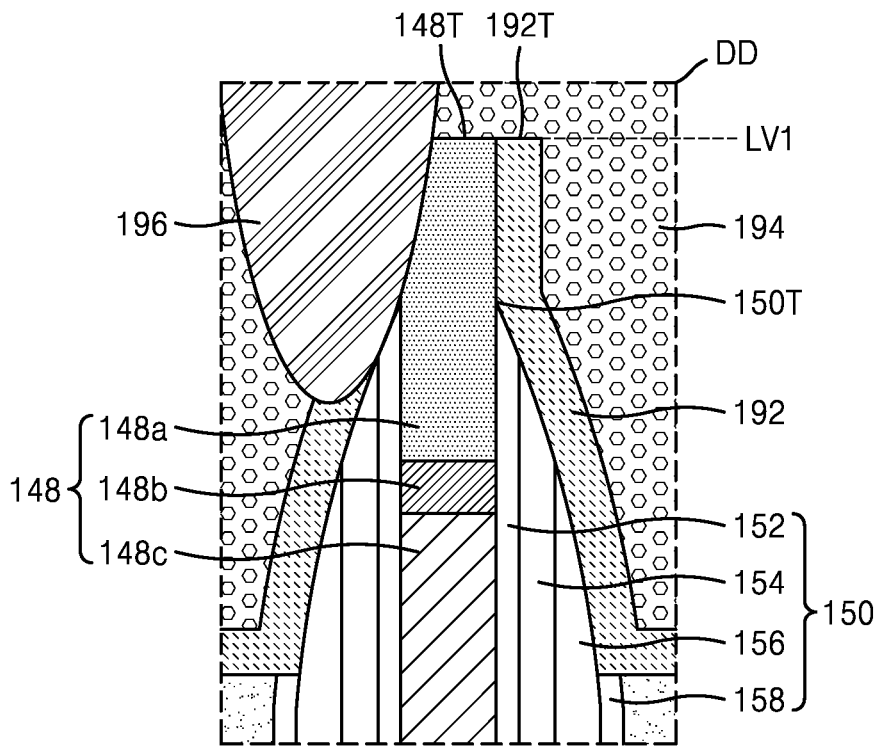

FIGS. 3A through 3D are cross-sectional views of main components of the integrated circuit device 10, according to embodiments. FIG. 3A is a cross-sectional view taken along line A-A' in FIGS. 1 and 2, FIG. 3B is a cross-sectional view taken along line B-B' in FIGS. 1 and 2, FIG. 3C is a cross-sectional view taken along line C-C' in FIG. 1, and FIG. 3D is an enlarged cross-sectional view of portion DD in FIG. 3A.

Referring to FIGS. 3A through 3D together, the integrated circuit device 10 may include a plurality of memory cell structures formed on the substrate 110 including the cell area CA and the core/periphery area PA. Main components constituting the integrated circuit device 10 according to embodiments will be described hereinafter.

The integrated circuit device 10 may include the substrate 110 including a plurality of active areas 118, a plurality of gate dielectric layers 122 sequentially formed inside a plurality of word line trenches 120T crossing the plurality of active areas 118 in the substrate 110, a plurality of word lines 120, and a plurality of buried insulating layers 124. In addition, the integrated circuit device 10 may include a device isolation layer 116, first and second insulating layer patterns 112 and 114 covering the plurality of buried insulating layers 124, a plurality of bit line structures 140 (refer to FIG. 7A) on the first and second insulating layer patterns 112 and 114, and a plurality of insulating spacers 150 covering both sidewalls of the plurality of bit line structures 140.

In addition, the integrated circuit device 10 may include a plurality of buried contacts 170 filling lower portions of spaces defined by a plurality of insulating fences 180 and the plurality of insulating spacers 150, and connected to the plurality of active areas 118, and a plurality of landing pads 194 filling upper portions of the spaces defined by the plurality of insulating fences 180 and the plurality of insulating spacers 150, extending to an upper portion of the bit line structure 140, and spaced apart from each other by a node separation pattern 196. Further, the integrated circuit device 10 may include a plurality of capacitor structures, which include a plurality of lower electrodes 210 respectively connected to the plurality of landing pads 194, a capacitor dielectric layer 220, and an upper electrode 230.

In the integrated circuit device 10, upper sidewalls of an insulation capping pattern 148 formed on an upper portion of each of the plurality of bit line structures 140 may not be covered with the insulating spacer 150. In other words, as illustrated in FIG. 3D, a vertical level of an uppermost surface 148T of the insulation capping pattern 148 may be higher than a vertical level of an uppermost surface of the insulating spacer 150, e.g., relative to the bottom of the substrate 110 in FIG. 3A. In this case, the vertical level of the uppermost surface 148T of the insulation capping pattern 148 may be referred to as a first level LV1. Accordingly, while the width of a portion of the landing pad 194 at the first level LV1, which is generally referred to as a neck of the landing pad 194, in the first horizontal direction (X direction) increases, a separation distance between two adjacent landing pads 194 may be sufficiently secured.

In the integrated circuit device 10, a barrier conductive layer 192 may be arranged to cover side surfaces of the insulation capping pattern 148, and the upper surface and side surfaces of the insulating spacer 150. For example, referring to FIG. 3A, the barrier conductive layer 192 may extend between adjacent ones of the bit line structures 140. For example, referring to FIGS. 3A and 3D, the barrier conductive layer 192 may be directly and conformally on the upper portions of the side surfaces of the insulation capping pattern 148, and may extend continuously on upper surfaces of the insulating spacer 150 and the buried contacts 170, e.g., to have a cross-sectional shape of a cup. For example, as further illustrated in FIGS. 3A and 3D, the vertical level of the uppermost surface 148T of the insulation capping pattern 148 and a vertical level of an uppermost surface 192T of the barrier conductive layer 192 may be the same as the first level LV1. In other words, the uppermost surface 148T of the insulation capping pattern 148 and the uppermost surface 192T of the barrier conductive layer 192 may be formed to be coplanar with each other to define a uniform and flat plane. As to be described below, this feature may be a result of performing a planarization process on the insulation capping pattern 148 and the barrier conductive layer 192.

In the integrated circuit device 10, the landing pad 194 may fill the inside of the barrier conductive layer 192, e.g., the landing pad 194 may fill the cup-shaped cross-section of the barrier conductive layer 192, and may extend above the insulation capping pattern 148. For example, the landing pad 194 may, e.g., directly, contact the uppermost surface 148T of the insulation capping pattern 148 and the barrier conductive layer 192, whereas the landing pad 194 may not directly contact the insulating spacer 150, e.g., the barrier conductive layer 192 may separate the landing pad 194 and the insulating spacer 150 therebetween. In other words, the upper surface of the insulating spacer 150 arranged to overlap the landing pad 194 in a vertical direction (Z direction) may be surrounded by the barrier conductive layer 192.

Accordingly, because outer walls of the insulating spacer 150 are not exposed, the insulating spacer 150 may not be damaged by a wet etching solution (e.g., a LAL solution) in a subsequent process for manufacturing the integrated circuit device 10. As such, the insulating performance of the insulating spacer 150 may be further improved. In this case, the wet etching solution, e.g., the LAL solution may be referred to as a hydrofluoric acid (HF) solution including ammonium fluoride ($NH_4F$), and may be used for etching a silicon oxide layer.

In the integrated circuit device 10, the node separation pattern 196 may be arranged to contact one side surface of the insulation capping pattern 148, e.g., so the node separation pattern 196 and the barrier conductive layer 192 may be on opposite sides of the insulation capping pattern 148 (FIG. 3A). For example, as illustrated in FIG. 3D, the node separation pattern 196 may contact the upper surface of the insulating spacer 150 arranged on the same side surface as the one side surface of the insulation capping pattern 148. In other words, a vertical level of a lowermost surface of the node separation pattern 196 may be lower than the vertical level of the uppermost surface of the insulating spacer 150, e.g., relative to the bottom of the substrate 110 in FIG. 3A. The node separation pattern 196 may be arranged, from an upper side thereof to a lower side thereof, to extend along a space between the landing pad 194 and a preliminary insulating spacer 150P. For example, the node separation pattern 196 may be round with a slope from the landing pad 194 toward the insulation capping pattern 148, which is an upper portion of the bit line structure 140. The center of a lower end of the node separation pattern 196 may be aligned with the center of an upper end of the barrier conductive layer 192 in the vertical direction (Z direction), e.g., the center of a lower end of the node separation pattern 196 may be aligned with an upper end of a portion of the barrier conductive layer 192 that covers, e.g., overlaps, the uppermost surface of the insulating spacer 150 (FIG. 3D).

In the integrated circuit device 10, a core structure 140D, which is formed on the core/periphery area PA and includes a barrier metal layer 192D on a side wall thereof, may be included. A vertical level of an uppermost surface of the core structure 140D and a vertical level of an uppermost surface of the barrier metal layer 192D may be substantially the same as each other, and may be the same as the first level LV1.

For example, as illustrated in FIG. 3C, in the core/periphery area PA, the core structure 140D and a conductive material layer 194D may be covered with insulating layers, e.g., a first insulating layer 175 and a second insulating layer 250. In other words, in the core/periphery area PA, a plurality of conductive wires and other components, which are electrically connected to the active area 118 and/or the core structure 140D, may be formed.

In the integrated circuit device 10, on an interface surface between the cell area CA and the core/periphery area PA, the vertical level of the uppermost surface 148T of the insulation capping pattern 148 and the vertical level of the uppermost surface of the core structure 140D may be substantially the same as each other, and may be the same as the first level LV1. In addition, a vertical level of an uppermost surface of the landing pad 194 in the cell area CA and a vertical level of an uppermost surface of the conductive material layer 194D including the same material as the landing pad 194 in the core/periphery area PA may be substantially the same as each other. This feature may be a result of performing a planarization process on the insulation capping pattern 148 and the barrier conductive layer 192.

The integrated circuit device 10 may secure production efficiency and stable operation performance because by planarizing the upper portion of the bit line structure 140, the uppermost surface of the insulation capping pattern 148 is coplanar with the uppermost surface of the barrier conductive layer 192. Further, the plurality of landing pads 194 with a regular conductive pattern having improved steps may be formed.

FIG. 4 is a flowchart of a manufacturing method S10 of an integrated circuit device, according to an embodiment.

Referring to FIG. 4, the manufacturing method S10 of an integrated circuit device may include a process sequence of first through eighth operations S110 through S180.

When a certain embodiment is implemented differently, a particular process sequence may also be executed differently from the sequence to be described. For example, two consecutively described processes may also be performed substantially at the same time or in a sequence opposite to the sequence to be described.

The manufacturing method S10 of an integrated circuit device may include the first operation S110 of forming a plurality of bit line structures on the upper portion of a substrate, the second operation S120 of forming a preliminary insulating spacer covering both sidewalls of each of the plurality of bit line structures, the third operation S130 of etching an upper portion of the preliminary insulating spacer to expose an upper portion of an insulation capping pattern, the fourth operation S140 of forming a barrier conductive layer conformally covering the plurality of bit line structures and insulating spacers, the fifth operation S150 of forming a first landing pad layer covering the barrier conductive layer, the sixth operation S160 of polishing the first landing pad layer and the barrier conductive layer to expose an upper surface of the insulation capping pattern, the seventh operation S170 of forming a second landing pad layer on the upper surface of the insulation capping pattern, and the eighth operation S180 of forming a landing pad by node separating the first landing pad layer and the second landing pad layer.

Technical characteristics of each of the first through eighth operations S110 through S180 is described below in detail with reference to FIGS. 5A through 13A and 5B through 13B, which illustrate stages in the manufacturing method of an integrated circuit device according to embodiments. FIGS. 5A through 13A are cross-sectional views taken along line A-A' in FIG. 2, and FIGS. 5B through 13B are cross-sectional views taken along line B-B' in FIG. 2.

Figure 5A:
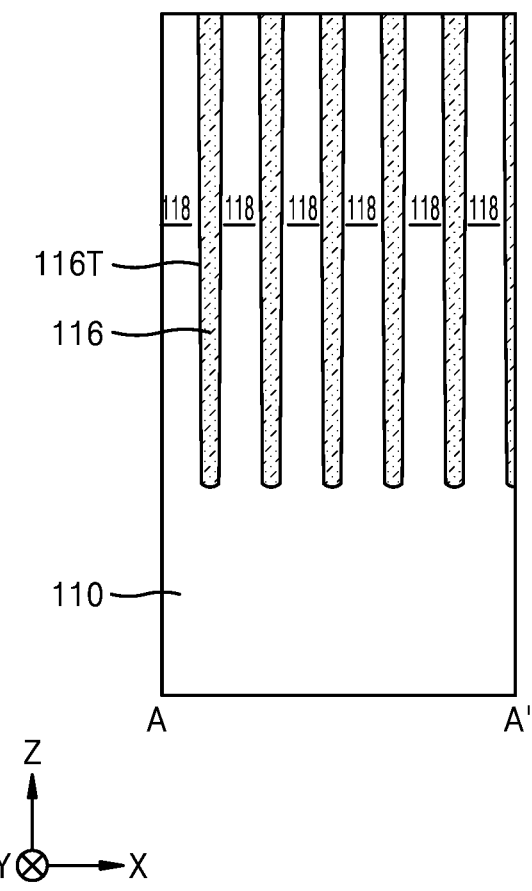
Figure 5B:
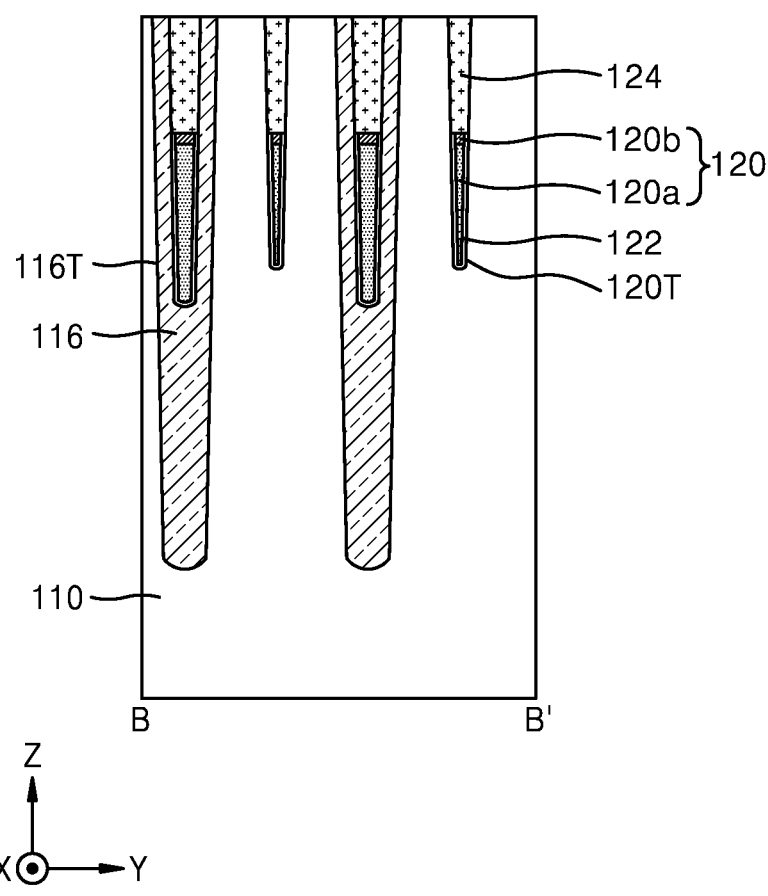

Referring to FIGS. 5A and 5B together, a device isolation trench 116T may be formed in the substrate 110, and the device isolation layer 116 filling the device isolation trench 116T may be formed. The device isolation layer 116 may include a material including at least one of, e.g., a silicon oxide layer, a silicon nitride layer, and a silicon oxynitride layer. The device isolation layer 116 may include a single layer including one type of an insulating layer, a double layer including two types of insulating layers, or a multiple layer including a combination of at least three types of insulating layers. For example, the device isolation layer 116 may include a double layer or a multiple layer including a silicon oxide layer and a silicon nitride layer.

The plurality of active areas 118 may be defined in the substrate 110 by the device isolation layer 116. The active area 118 may have a relatively long island shape having a short axis and a long axis in a plan view, like the active area ACT illustrated in FIG. 2.

The plurality of word line trenches 120T may be formed in the substrate 110. The plurality of word line trenches 120T may extend in parallel with each other in the first horizontal direction (X direction), and may have a line shape, in which each of the plurality of word line trenches 120T crosses the active area 118 and is arranged at an equal interval in the second horizontal direction (Y direction). In some embodiments, a step may be formed on a bottom surface of the plurality of word line trenches 120T.

In some embodiments, in the plurality of word line trenches 120T, the device isolation layer 116 and the substrate 110 may be etched by using separate etching processes, so that an etching depth of the device isolation layer 116 is different from an etching depth of the substrate 110. In other embodiments, the plurality of word line trenches 120T may be etched together with the device isolation layer 116 and the substrate 110, but due to a difference in etching rates between the device isolation layer 116 and the substrate 110, the etching depth of the device isolation layer 116 may be different from the etching depth of the substrate 110.

After cleaning a resultant product, in which the plurality of word line trenches 120T have been formed, the plurality of gate dielectric layers 122, the plurality of word lines 120, and the plurality of buried insulating layers 124 may be sequentially formed in the plurality of word line trenches 120T. The plurality of word lines 120 may constitute the plurality of word lines WL illustrated in FIG. 2. The plurality of word lines 120 may extend in parallel with each other in the first horizontal direction (X direction), and may have a line shape, in which each of the plurality of word lines 120 crosses the active area 118 and is arranged at an equal interval in the second horizontal direction (Y direction). An upper surface of each of the plurality of word lines 120 may be at a level lower than the upper surface of the substrate 110. In addition, bottom surfaces of the plurality of word lines 120 may have a concave-convex shape, and saddle fin transistors having a saddle fin structure (saddle FinFET) may be formed in the plurality of active areas 118.

In some embodiments, each of the plurality of word lines 120 may have a stacked structure including a lower word line layer 120a and an upper word line layer 120b. For example, the lower word line layer 120a may include a metal material, conductive metal nitride, or a combination thereof In some embodiments, the lower word line layer 120a may include, e.g., Ti, TiN, Ta, TaN, W, WN, TiSiN, WSiN, or a combination thereof. For example, the upper word line layer 120b may include doped polysilicon.

In some embodiments, before or after forming the plurality of word lines 120, impurity ions may be injected into the active area 118 on both sides of the plurality of word lines 120 to form a source/drain area inside the substrate 110.

The gate dielectric layer 122 may include at least one of, e.g., a silicon oxide layer, a silicon nitride layer, a silicon oxynitride layer, an oxide/nitride/oxide (ONO) layer, and a high dielectric layer having a higher dielectric constant than the silicon oxide layer. In some embodiments, the gate dielectric layer 122 may include at least one material of, e.g., hafnium oxide (HfO), hafnium silicate (HfSiO), hafnium oxynitride (HfON), hafnium silicon oxynitride (HfSiON), or lanthanum oxide (LaO), lanthanum aluminum oxide (LaAlO), zirconium oxide (ZrO), zirconium silicate (ZrSiO), zirconium oxynitride (ZrON), zirconium silicon oxynitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (AlO), and lead scandium tantalum oxide (PbScTaO). For example, the gate dielectric layer 122 may include $HfO_2$, $Al_2O_3$, $HfAlO_3$, $Ta_2O_3$, or $TiO_2$.

Upper surfaces of the plurality of buried insulating layers 124 may be at substantially the same vertical level as the upper surface of the substrate 110. The buried insulating layer 124 may include at least one material layer of, e.g., a silicon oxide layer, a silicon nitride layer, a silicon oxynitride layer, and a combination thereof.

Figure 6A:
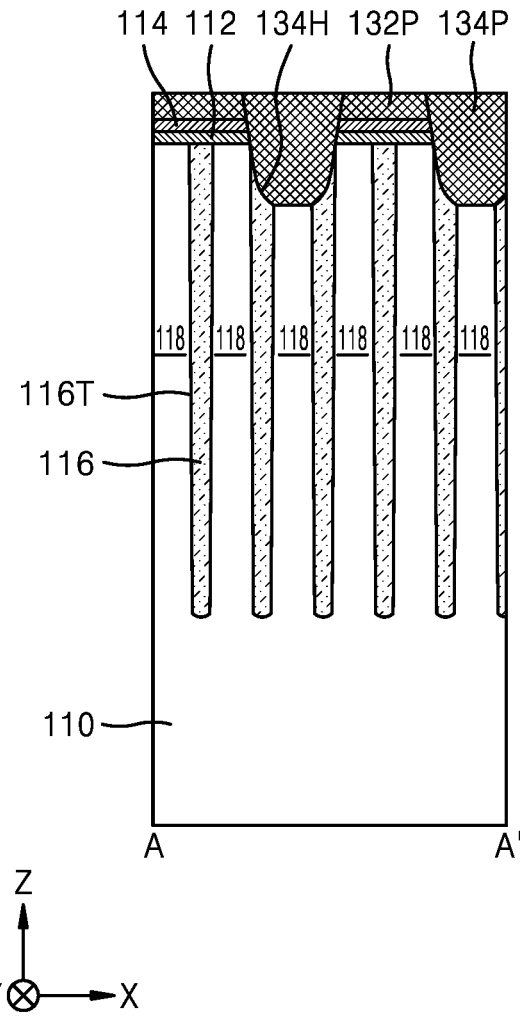
Figure 6B:
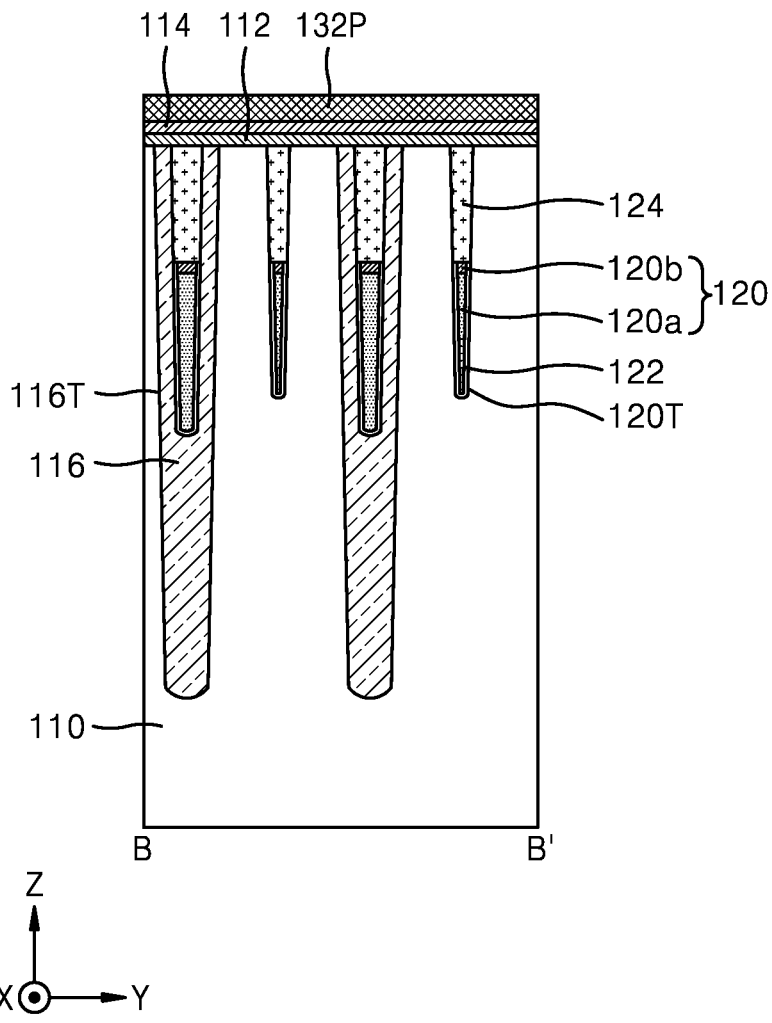

Referring to FIGS. 6A and 6B together, the first and second insulating layer patterns 112 and 114 covering the device isolation layer 116, the plurality of active areas 118, and the plurality of buried insulating layers 124 may be formed.

The first and second insulating layer patterns 112 and 114 may include, e.g., a silicon oxide layer, a silicon nitride layer, a silicon oxynitride layer, or a combination thereof In some embodiments, the first and second insulating layer patterns 112 and 114 may be formed by stacking a plurality of insulating layers including the first insulating layer pattern 112 and the second insulating layer pattern 114. In some embodiments, the first insulating layer pattern 112 may include a silicon oxide layer, and the second insulating layer pattern 114 may include a silicon nitride layer. In other embodiments, the first insulating layer pattern 112 may include a non-metal dielectric layer, and the second insulating layer pattern 114 may include a metal dielectric layer.

After a conductive semiconductor layer 132P is formed on the first and second insulating layer patterns 112 and 114, a direct contact hole 134H penetrating the conductive semiconductor layer 132P and the first and second insulating layer patterns 112 and 114 and exposing the source/drain area in the active area 118 may be formed, and a direct contact-purpose conductive layer 134P filling the direct contact hole 134H may be formed. The direct contact hole 134H may extend from the active area 118 to the inside of the source/drain area.

The conductive semiconductor layer 132P may include, e.g., doped polysilicon. The direct contact-purpose conductive layer 134P may include, e.g., doped polysilicon, tungsten (W), tungsten nitride (WN), cobalt (Co), nickel (Ni), aluminum (Al), molybdenum (Mo), ruthenium (Ru), titanium nitride (TiN), tantalum (Ta), tantalum nitride (TaN), copper (Cu), or a combination thereof.

In other embodiments, after the direct contact hole 134H penetrating the first and second insulating layer patterns 112 and 114 and exposing the source/drain area in the active area 118 is formed, the conductive semiconductor layer 132P filling the direct contact holes 134H and the first and second insulating layer patterns 112 and 114, and the direct contact-purpose conductive layer 134P may also be formed together.

Figure 7A:
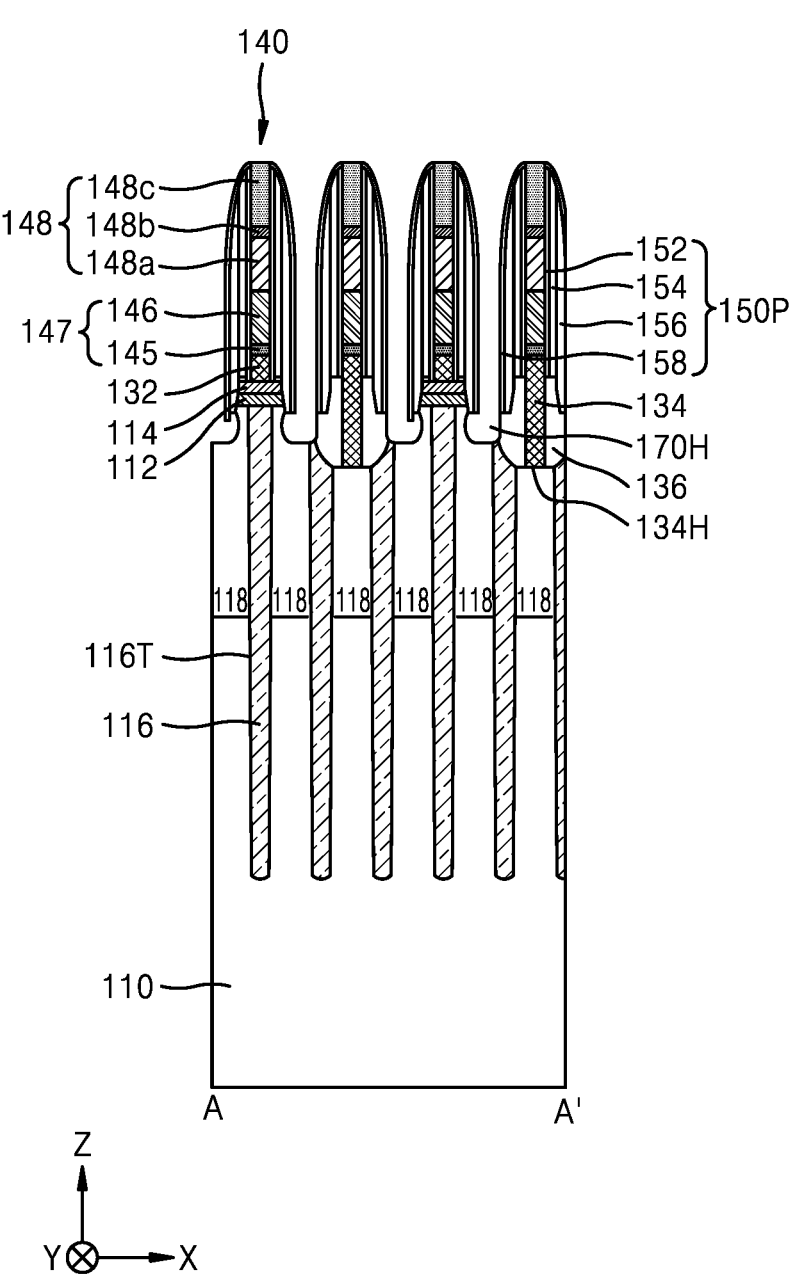
Figure 7B:
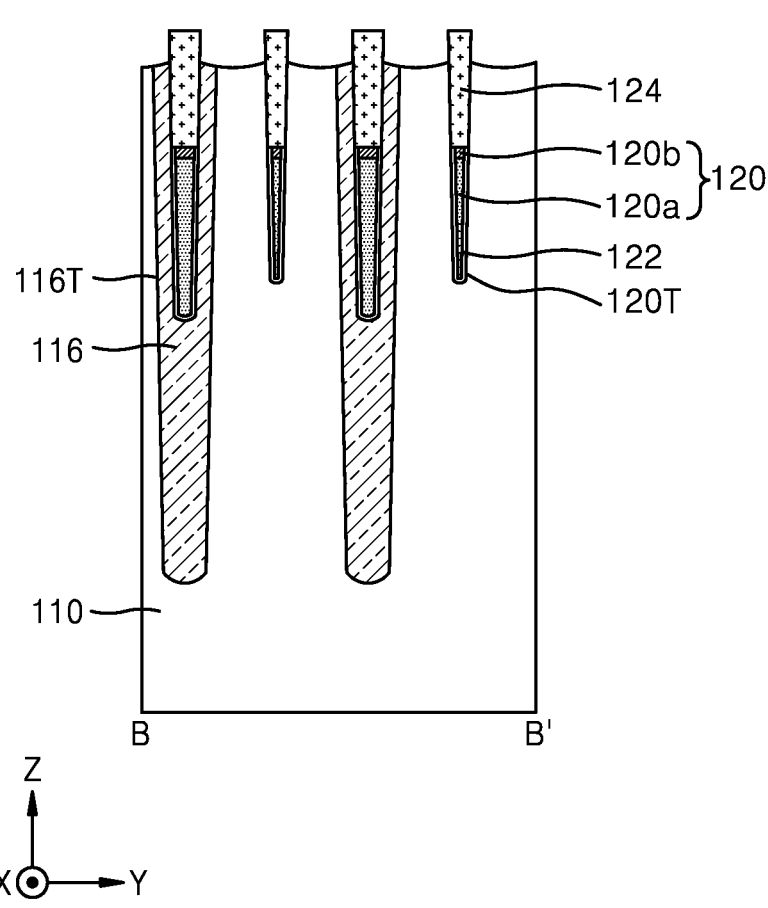

Referring to FIGS. 7A and 7B together, a metal-based conductive layer and an insulation capping layer for covering the conductive semiconductor layer 132P and the direct contact-purpose conductive layer 134P, respectively, and forming the bit line structure 140 may be sequentially formed.

In some embodiments, the metal-based conductive layer may have a stacked structure including a first metal-based conductive layer and a second metal-based conductive layer. For example, the metal-based conductive layer may have a conductive layer stacked structure of a double layer structure. In another example, the metal-based conductive layer may have a plurality of stacked structures of a single layer or three or more layers.

In some embodiments, the insulation capping layer may have a stacked structure including a first insulation capping layer, a second insulation capping layer, and a third insulation capping layer. For example, the insulation capping layer may have an insulation layer stacked structure of a triple layer structure. In another example, the insulation capping layer may have a plurality of stacked structures of a single layer, a double layer, or four or more layers.

By etching the first metal-based conductive layer, the second metal-based conductive layer, and the insulation capping layer, a plurality of bit lines 147 including a first metal-based pattern 145 and a second metal-based pattern 146 in a line shape, and a plurality of insulation capping patterns 148 may be formed. For example, the first metal-based pattern 145 may include titanium nitride (TiN) or TSN (Ti—Si—N), and the second metal-based pattern 146 may include tungsten (W) or tungsten silicide ($WSi_x$).

In some embodiments, the plurality of insulation capping patterns 148 may have a stacked structure including a first insulation capping pattern 148a, a second insulation capping pattern 148b, and a third insulation capping pattern 148c. In some embodiments, each of the first insulation capping pattern 148a, the second insulation capping pattern 148b, and the third insulation capping pattern 148c may include a silicon-based insulating layer, e.g., the third insulation capping pattern 148c may include a silicon nitride layer.

One bit line 147 and one insulation capping pattern 148 covering the one bit line 147 may constitute one bit line structure 140. Each of the plurality of bit line structures 140 including the plurality of bit lines 147 and the plurality of insulation capping patterns 148 may extend in parallel with each other and extend on a main surface of the substrate 110 in the second horizontal direction (Y direction). The plurality of bit lines 147 may constitute the plurality of bit lines BL illustrated in FIG. 2. In some embodiments, the bit line structure 140 may further include a conductive semiconductor pattern 132, which is a portion of the conductive semiconductor layer (refer to 132P in FIG. 6A) arranged between the first and second insulating layer patterns 112 and 114, and the first metal-based pattern 145.

In an etching process for forming the plurality of bit lines 147, by removing a portion of the direct contact-purpose conductive layer (refer to 134P in FIG. 6A), which does not vertically overlap the bit line 147, by using an etching process, a plurality of direct contact patterns 134 may be formed. In this case, the first and second insulating layer patterns 112 and 114 may function as an etching stop layer in an etching process of forming the plurality of bit lines 147 and the plurality of direct contact patterns 134. The plurality of direct contact patterns 134 may respectively constitute the plurality of direct contacts DC illustrated in FIG. 2. The plurality of bit lines 147 may be electrically and respectively connected to the plurality of active areas 118 via the plurality of direct contact patterns 134.

After the bit line structure 140 is formed, in the process of forming the direct contact pattern 134, a buried insulating pattern 136 may be formed to fill a portion of the direct contact hole 134H, from which a portion of the direct contact-purpose conductive layer (refer to 134P in FIG. 6A) has been removed. The buried insulating pattern 136 may include, e.g., a silicon nitride layer.

Both sidewalls of each of the plurality of bit line structures 140 may be covered by a preliminary insulating spacer 150P. Each of the plurality of preliminary insulating spacers 150P may include a first insulating spacer 152, a second insulating spacer 154, a third insulating spacer 156, and a fourth insulating spacer 158. In some embodiments, each of the plurality of preliminary insulating spacers 150P may not include any one of the third insulating spacer 156 and the fourth insulating spacer 158. In other words, each of the plurality of preliminary insulating spacers 150P may include the first insulating spacer 152, the second insulating spacer 154, and the third insulating spacer 156. Alternatively, each of the plurality of preliminary insulating spacers 150P may include the first insulating spacer 152, the second insulating spacer 154, and the fourth insulating spacer 158.

A plurality of buried contact holes 170H may be formed between the plurality of bit lines 147. An inner space of the plurality of buried contact holes 170H may be defined by the active area 118 and the preliminary insulating spacer 150P, which covers the sidewalls of each two adjacent bit lines 147 among the plurality of bit lines 147.

The plurality of buried contact holes 170H may be formed by removing portions of the first and second insulating layer patterns 112 and 114 and the active area 118, by using the plurality of insulation capping patterns 148 and the preliminary insulating spacer 150P as etching masks. In some embodiments, by first performing an anisotropic etching process of removing portions of the first and second insulating layer patterns 112 and 114, and a portion of the active area 118, and by further performing an anisotropic etching process of removing the other portion of the active area 118, the plurality of buried contact holes 170H may be formed so that a space thereof defined by the active area 118 is expanded.

Figure 8A:
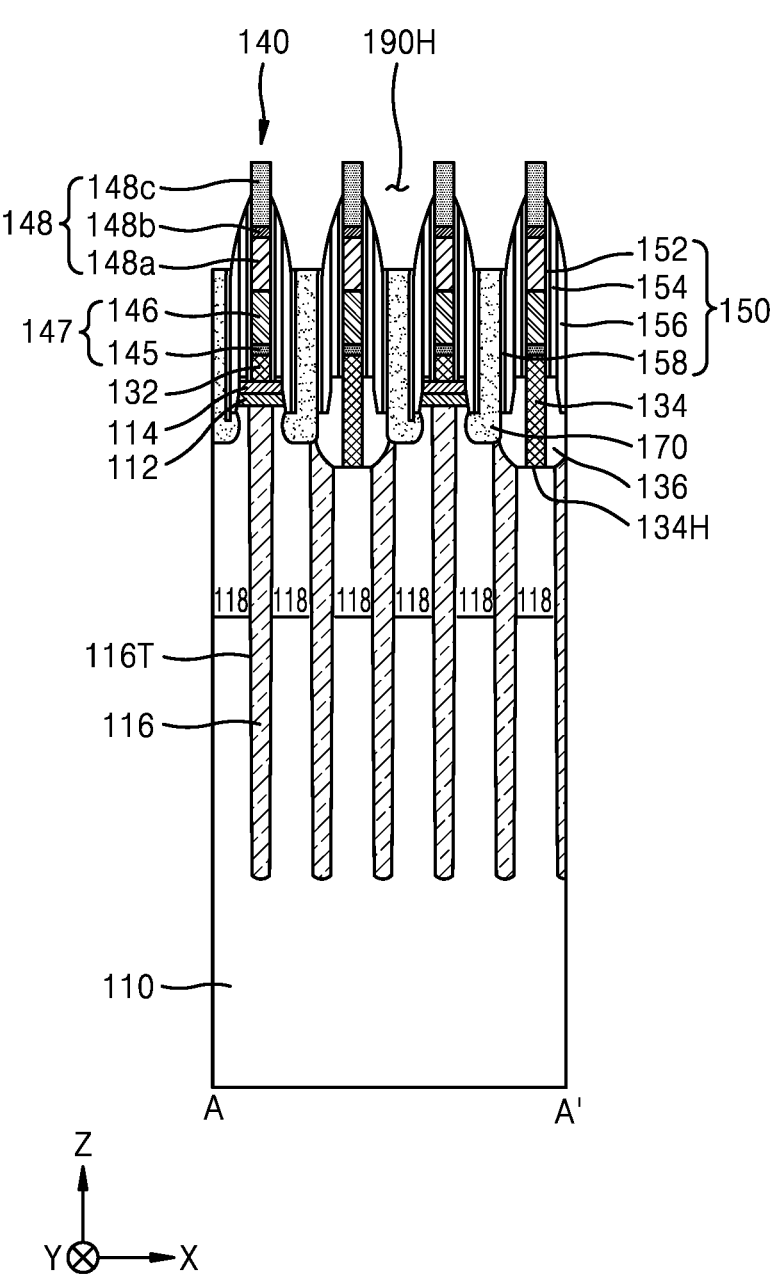
Figure 8B:
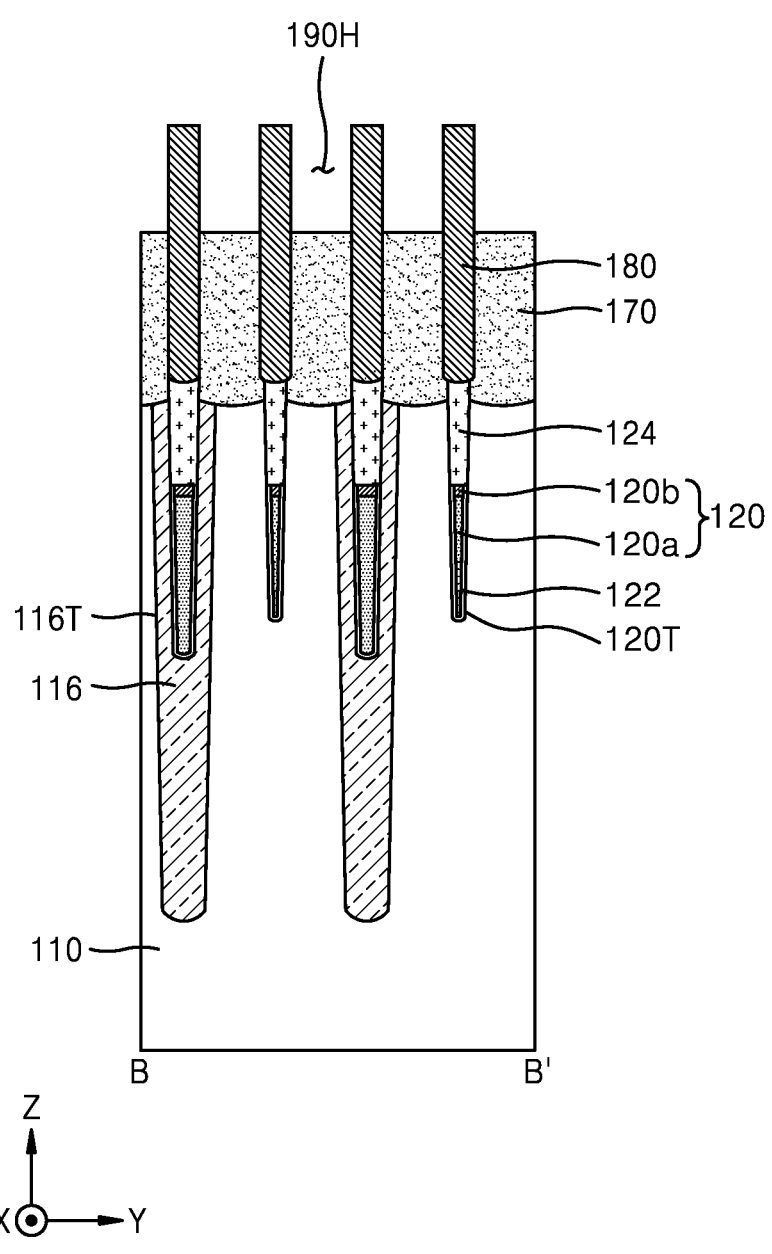

Referring to FIGS. 8A and 8B together, the plurality of buried contacts 170 and the plurality of insulating fences 180 may be formed in a space between the plurality of preliminary insulating spacers (refer to 150P in FIG. 7A) covering both sidewalls of each of the plurality of bit line structures 140, and the insulating spacer 150 may be formed by etching an upper portion of the preliminary insulating spacer (refer to 150P in FIG. 7A).

The plurality of buried contacts 170 and the plurality of insulating fences 180 may be alternately arranged, along a pair of preliminary insulating spacers (refer to 150P in FIG. 7A) facing each other among the plurality of preliminary insulating spacers (refer to 150P in FIG. 7A) covering the both sidewalls of the plurality of bit line structures 140. For example, the plurality of buried contacts 170 may include doped polysilicon, and the plurality of insulating fences 180 may include a silicon nitride layer.

The plurality of buried contacts 170 may extend from the active area 118 in the vertical direction (Z direction) perpendicular to the substrate 110. The plurality of buried contacts 170 may constitute the plurality of buried contacts BC illustrated in FIG. 2. The plurality of buried contacts 170 may be arranged in a space defined by the plurality of insulating fences 180 and the plurality of preliminary insulating spacers (refer to 150P in FIG. 7A). In addition, the plurality of buried contacts 170 may fill a portion of a lower side of a space between the plurality of preliminary insulating spacers (refer to 150P in FIG. 7A).

The upper surface of the plurality of buried contacts 170 may be at a lower vertical level than an upper surface of the plurality of insulation capping patterns 148. In addition, an upper surface of the plurality of insulating fences 180 and the upper surface of the plurality of insulation capping patterns 148 may be at substantially the same vertical level.

A plurality of landing pad holes 190H may be defined by the plurality of preliminary insulating spacers (refer to 150P in FIG. 7A) and the plurality of insulating fences 180. The plurality of buried contacts 170 may be exposed at bottom surfaces of the plurality of landing pad holes 190H.

In a process of forming the plurality of buried contacts 170 and/or the plurality of insulating fences 180, the insulating spacer 150 may be formed by removing a portion of the upper side of the preliminary insulating spacer (refer to 150P in FIG. 7A), and portions of the upper surface and the side surfaces of the insulation capping pattern 148 may be exposed to the outside. Alternatively, by etching the upper portion of the preliminary insulating spacer (refer to 150P in FIG. 7A) by using an additional etching process so that the upper portion of the insulation capping pattern 148 is exposed, the insulating spacer 150 may be formed.

Figure 9A:
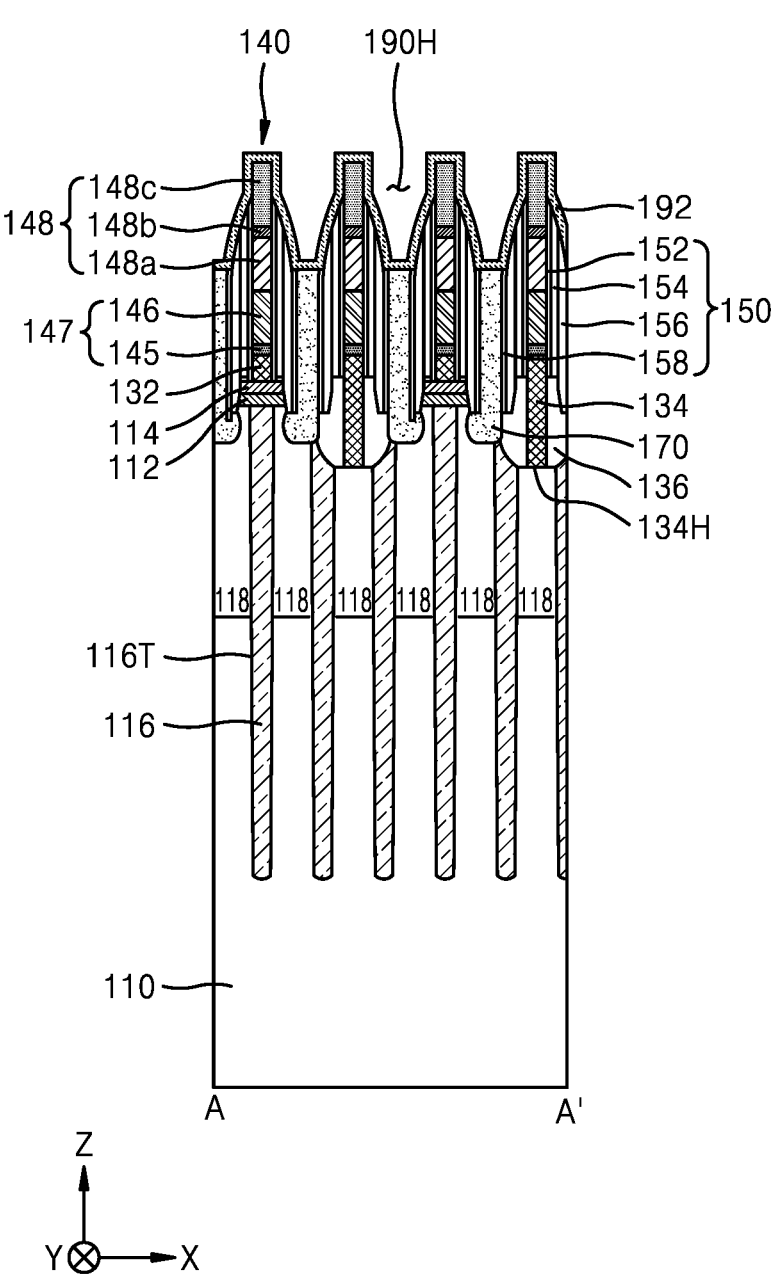
Figure 9B:
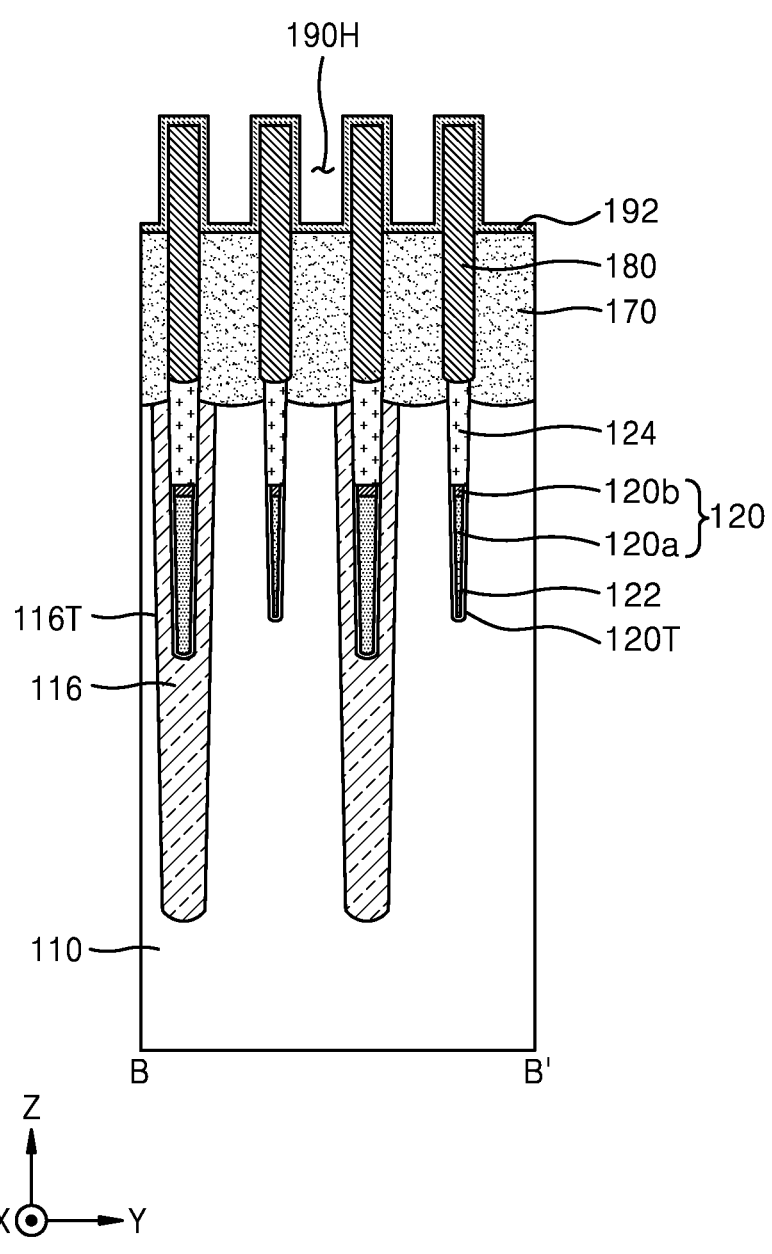

Referring to FIGS. 9A and 9B together, the barrier conductive layer 192 conformally covering the plurality of bit line structures 140 may be formed along the plurality of landing pad holes 190H. For example, the barrier conductive layer 192 may include a metal, a conductive metal nitride, or a combination thereof. In some embodiments, the barrier conductive layer 192 may have a Ti/TiN stacked structure or a TiN stacked structure.

In some embodiments, a metal silicide layer may be formed on the plurality of buried contacts 170 before the barrier conductive layer 192 is formed. The metal silicide layer may be arranged between the plurality of buried contacts 170 and the barrier conductive layer 192. The metal silicide layer may include, e.g., cobalt silicide ($CoSi_x$), nickel silicide ($NiSi_x$), or manganese silicide ($MnSi_x$).

The barrier conductive layer 192 may cover both the upper portion of the insulation capping pattern 148 and the upper portion of the insulating spacer 150. In addition, the barrier conductive layer 192 may cover both an upper surface of the buried contact 170 and an upper portion of the insulating fence 180.

Figure 10A:
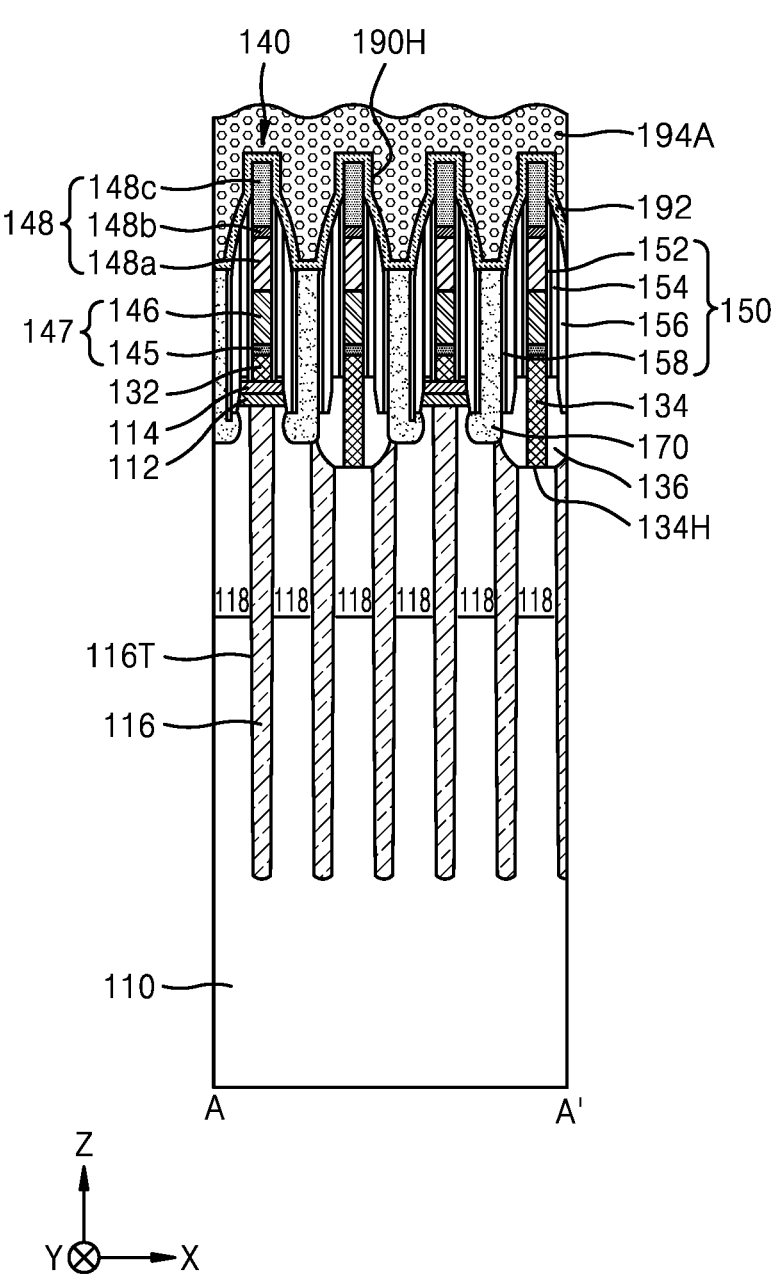
Figure 10B:
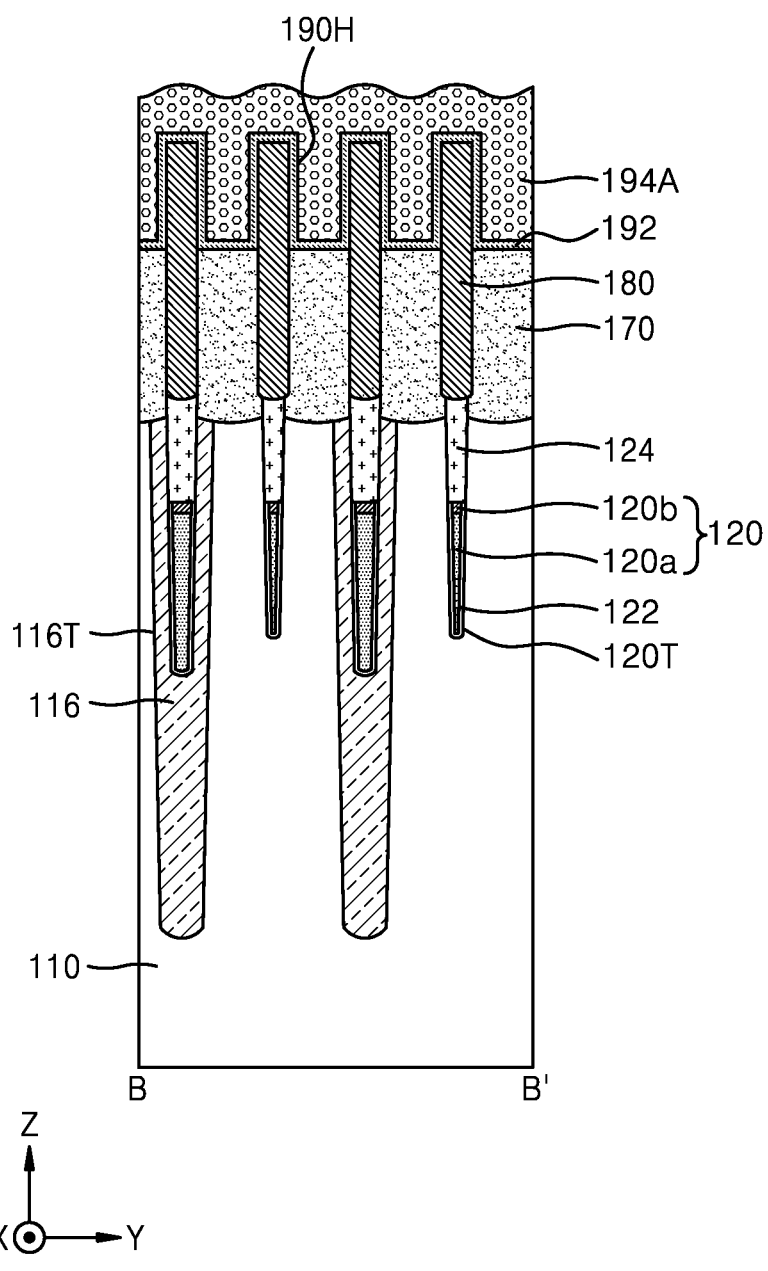

Referring to FIGS. 10A and 10B together, a first landing pad layer 194A filling the plurality of landing pad holes 190H and covering the barrier conductive layer 192 may be formed, e.g., the first landing pad layer 194A may fill a space (e.g., a cavity) defined by and above the barrier conductive layer 192. The first landing pad layer 194A may include, e.g., tungsten (W). In some embodiments, because the first landing pad layer 194A is formed on the barrier conductive layer 192 and fills the plurality of landing pad holes 190H, a lower surface and an upper surface of the first landing pad layer 194A may be formed as irregular surfaces. In some embodiments, the first landing pad layer 194A may constitute a lower area of the landing pad (refer to 194 in FIG. 13A).

Figure 11A:
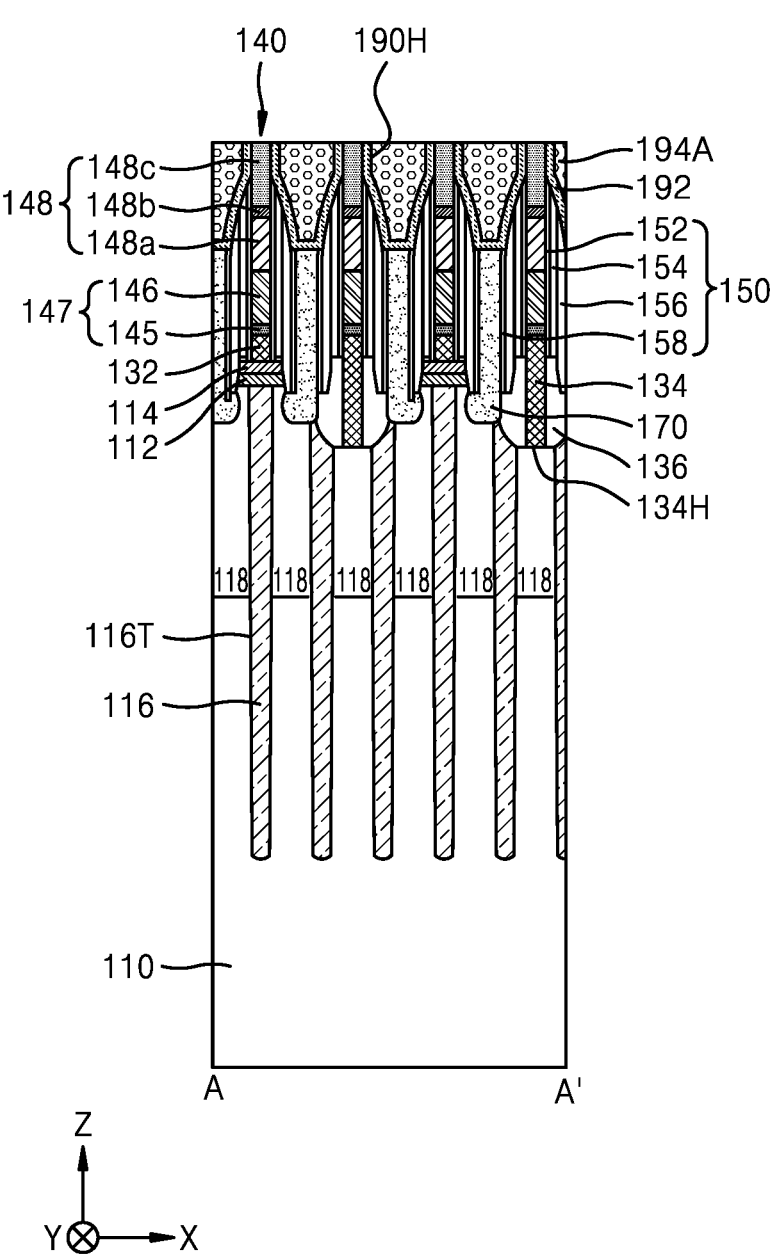
Figure 11B:
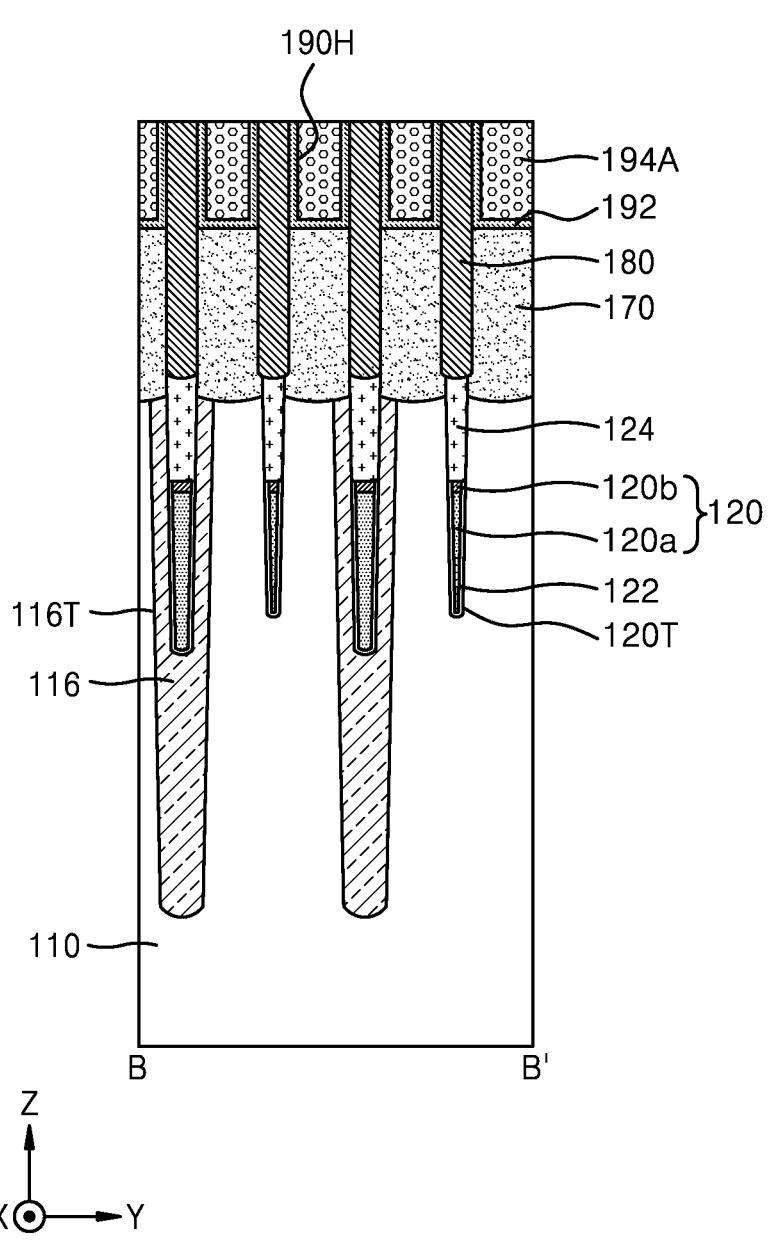

Referring to FIGS. 11A and 11B together, the first landing pad layer 194A and the barrier conductive layer 192 may be polished so that the upper surface of the insulation capping pattern 148 is exposed. For example, the polishing and planarization processes may be performed by using a grinder.

For example, the polishing and planarization processes may include a chemical mechanical polishing process. The grinder may remove a portion of the first landing pad layer 194A and a portion of the barrier conductive layer 192 by using polishing and planarization processes, and may form a flat surface where the uppermost surface of the plurality of insulation capping patterns 148 is exposed. After the polishing and planarization processes are completed, the uppermost surface of the insulation capping pattern 148, the uppermost surface of the barrier conductive layer 192, and the uppermost surface of the first landing pad layer 194A may form a coplanar surface.

In addition, steps in the cell area (refer to CA in FIG. 1) and the core/periphery area (refer to PA in FIG. 1) may be removed by using a chemical mechanical polishing process. In this manner, the steps caused by a difference between a lower portion structure of the cell area (refer to CA in FIG. 1) and a lower portion structure of the core/periphery area (refer to PA in FIG. 1) may be removed, and accordingly, patterning defects caused due to the steps in the subsequent process may be prevented.

Figure 12A:
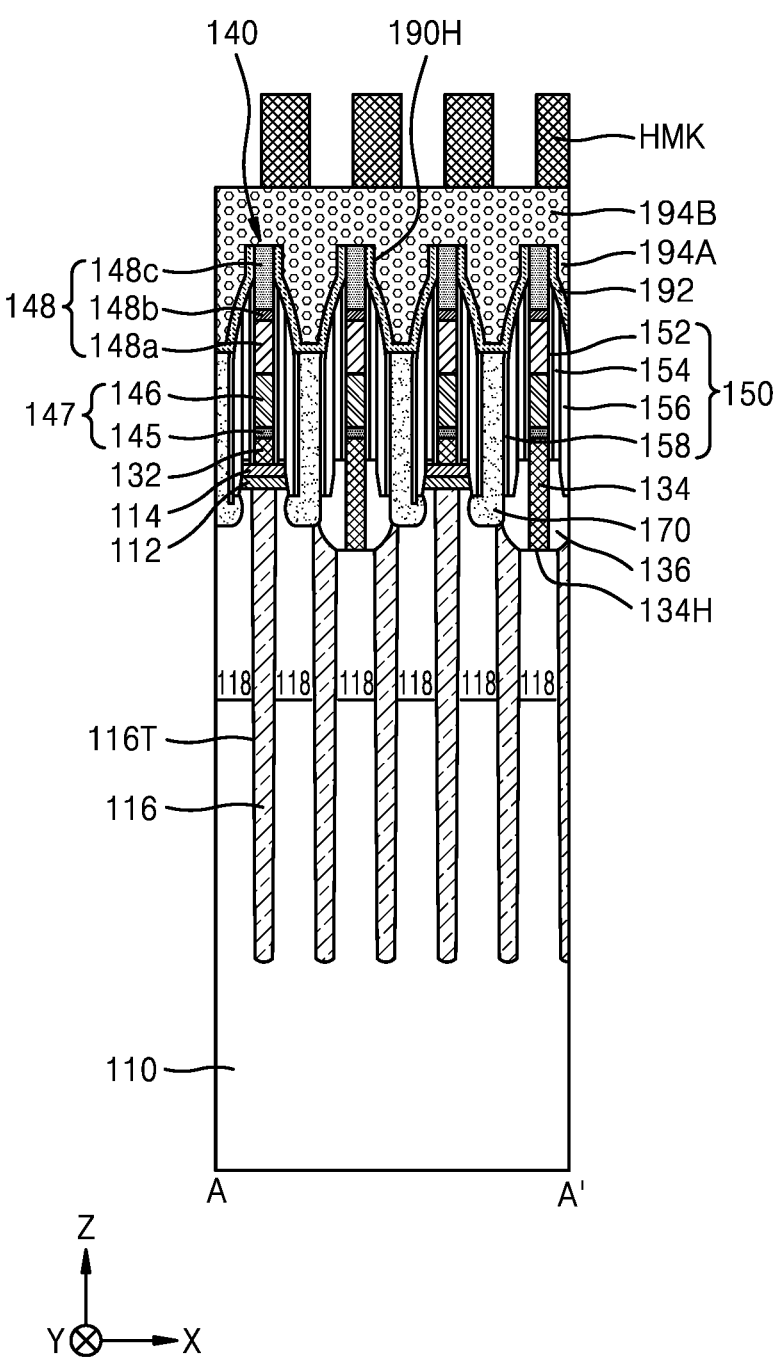
Figure 12B:
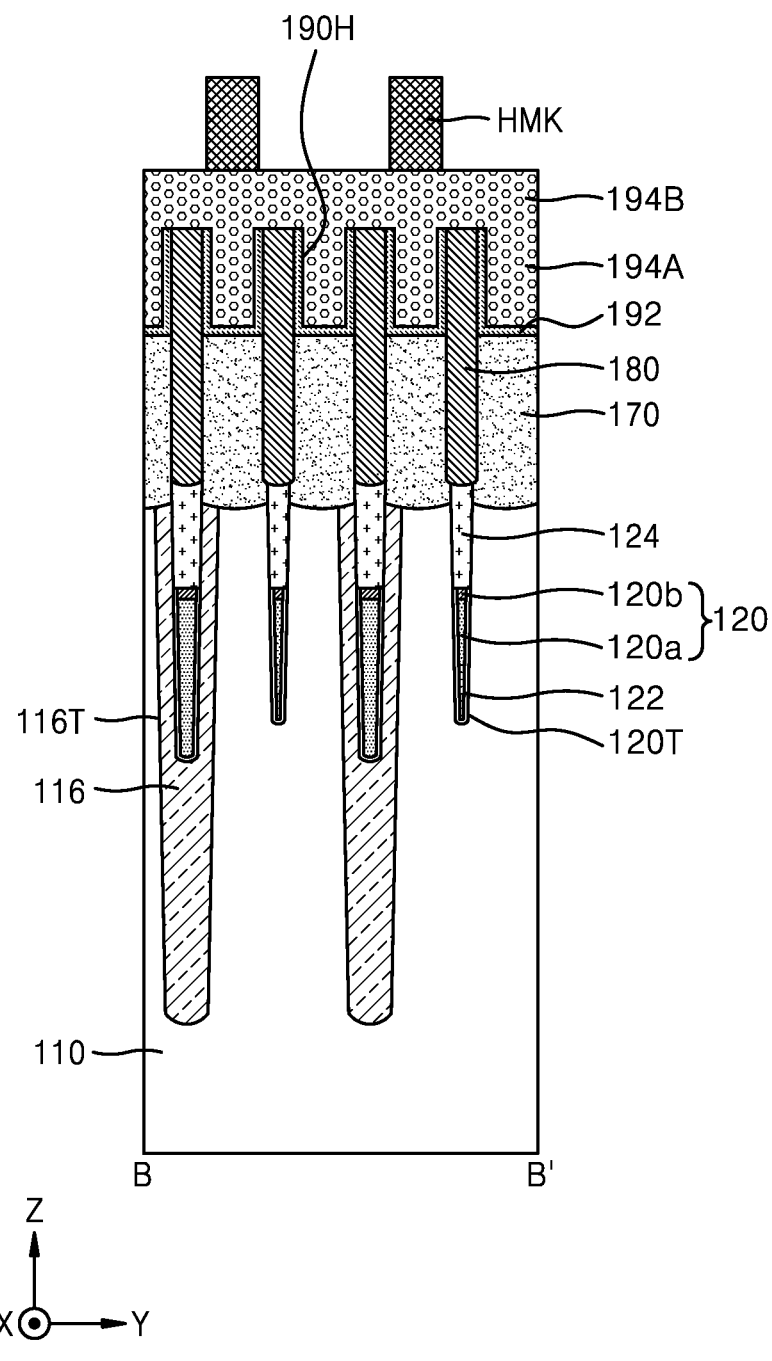

Referring to FIGS. 12A and 12B together, a second landing pad layer 194B may be formed on the upper surface of the plurality of insulation capping patterns 148, the upper surface of the barrier conductive layer 192, and the upper surface of the first landing pad layer 194A, on which the grinding process has been completed. The second landing pad layer 194B may include a same material as the first landing pad layer 194A, e.g., tungsten (W).

In other words, because the first landing pad layer 194A and the second landing pad layer 194B include a substantially same material, a boundary line therebetween may be ambiguous, e.g., there may be no boundary line between the first landing pad layer 194A and the second landing pad layer 194B. In some embodiments, because the second landing pad layer 194B is formed on the upper surfaces of the plurality of insulation capping patterns 148, the upper surface of the barrier conductive layer 192, and the upper surface of the first landing pad layer 194A, which have been planarized, a lower surface and an upper surface of the second landing pad layer 194B may be formed as flat surfaces. In some embodiments, the second landing pad layer 194B may constitute an upper area of the landing pad (refer to 194 in FIG. 13A).

A plurality of hard mask patterns HMK may be formed on the second landing pad layer 194B. In some embodiments, the plurality of hard mask patterns HMK may be formed by using an argon fluoride (ArF) lithography process or an extreme ultraviolet (EUV) lithography process.

Figure 13A:
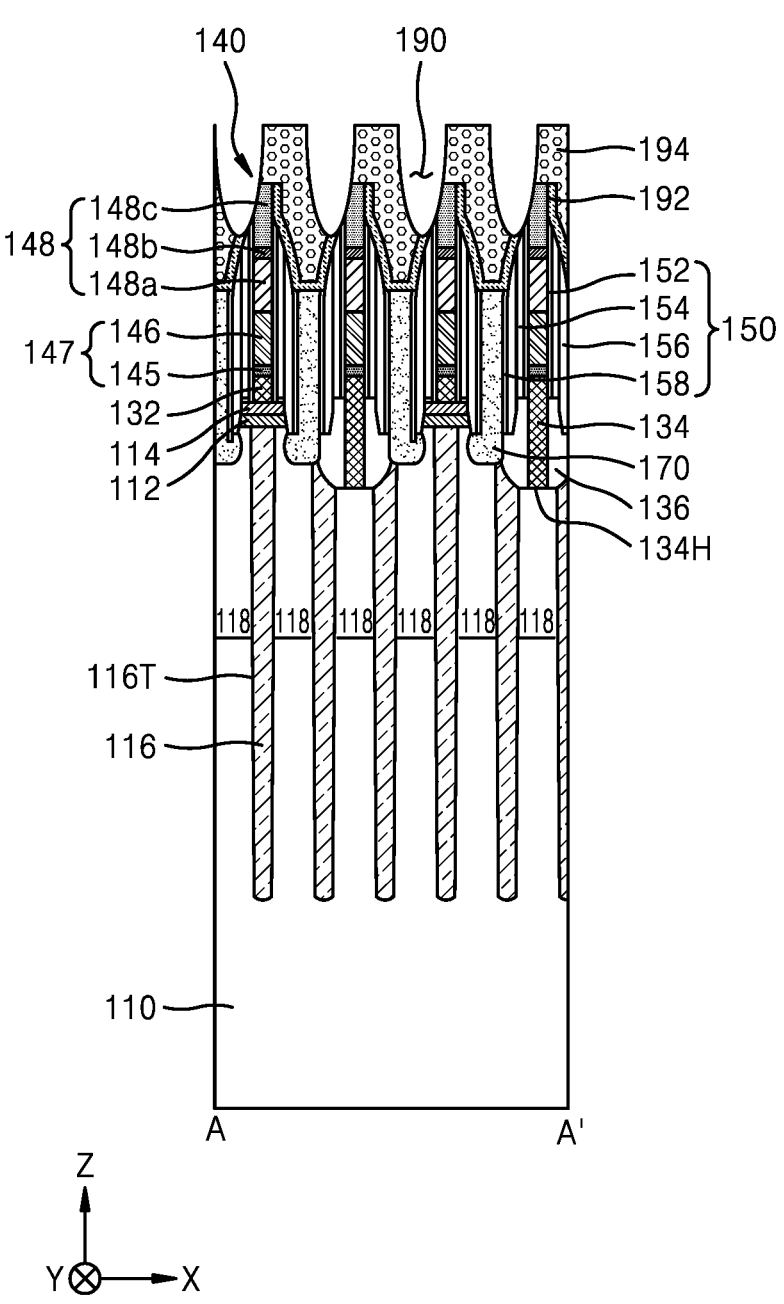
Figure 13B:
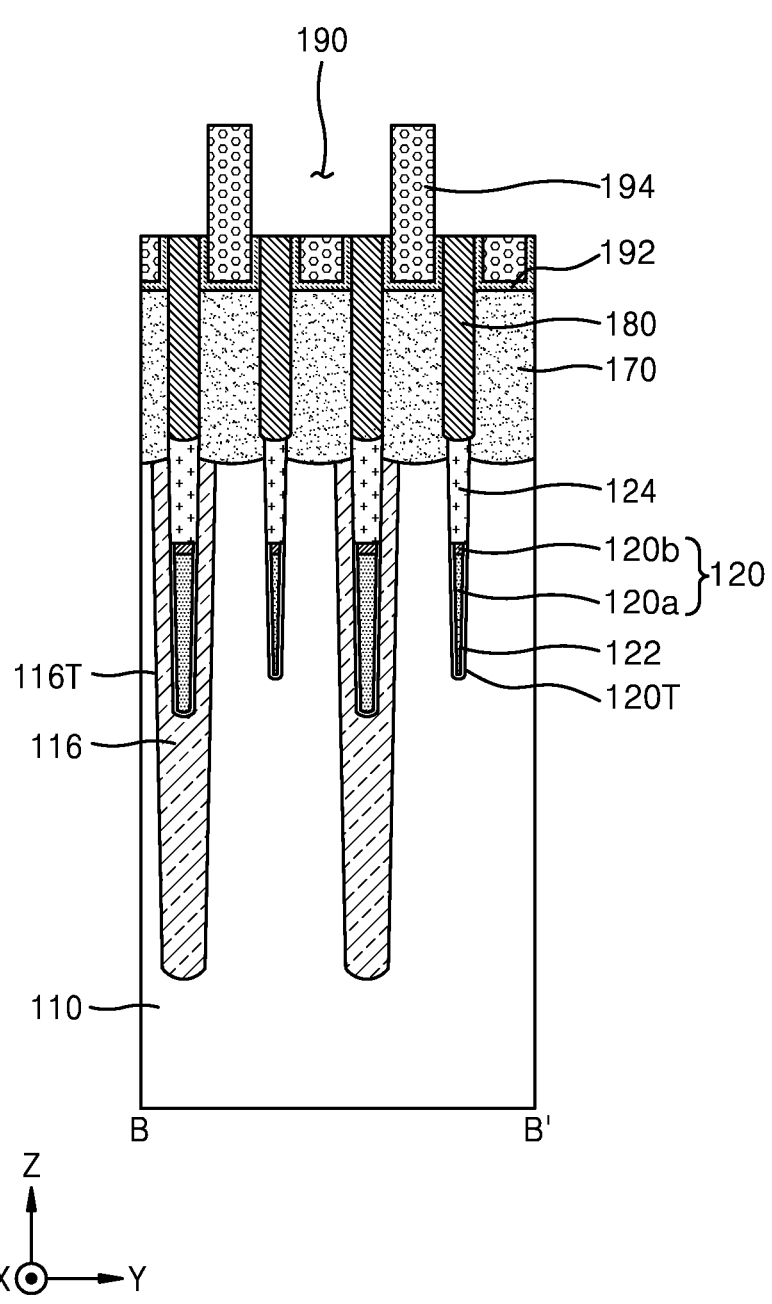

Referring to FIGS. 13A and 13B together, a recess 190 may be formed, by performing an etching process of removing portions of the first landing pad layer 194A and the second landing pad layer 194B by using the plurality of hard mask patterns HMK (FIG. 12A) as an etching mask. In the etching process of forming the recess 190, a portion of an upper side of the plurality of insulating spacers 150, a portion of an upper side of the plurality of insulation capping patterns 148, a portion of an upper side of the barrier conductive layer 192, and a portion of an upper side of the plurality of insulating fences 180 may be removed.

The first landing pad layer 194A and the second landing pad layer 194B may be formed as the plurality of landing pads 194, by using a process of dividing one body into a plurality by the recess 190, i.e., by using a process generally referred to as a node separation process. The plurality of landing pads 194 may be spaced apart from each other by the recess 190 therebetween.

The plurality of landing pads 194 may be respectively arranged on the plurality of buried contacts 170, and may extend onto the plurality of bit line structures 140. In some embodiments, the plurality of landing pads 194 may extend onto the plurality of bit lines 147. The plurality of landing pads 194 may be respectively arranged on the plurality of buried contacts 170, and the plurality of buried contacts 170 may be electrically connected to the plurality of landing pads 194 corresponding thereto. The plurality of landing pads 194 may be electrically connected to the active area 118 via the plurality of buried contacts 170.

The plurality of landing pads 194 may constitute the plurality of landing pads LP illustrated in FIG. 2. Each of the plurality of landing pads 194 may be formed on the barrier conductive layer 192. In some embodiments, the plurality of landing pads 194 may include tungsten (W). The buried contact 170 may be arranged between two adjacent bit line structures 140, and the landing pad 194 may extend from a space between two adjacent bit line structures 140 with the buried contact 170 therebetween onto one bit line structure 140.

Referring to FIGS. 3A and 3B, after the node separation pattern 196 filling the recess 190 is formed, the plurality of lower electrodes 210, the capacitor dielectric layer 220, and the upper electrode 230 may be sequentially formed on the plurality of landing pads 194, and the integrated circuit device 10 including a plurality of capacitor structures 200 may be formed.

In some embodiments, the node separation pattern 196 may include an interlayer insulating layer and an etching stop layer. For example, the interlayer insulating layer may include a silicon oxide layer, and the etching stop layer may include a silicon nitride layer.

The plurality of lower electrodes 210 may be respectively and electrically connected to the plurality of landing pads 194. The capacitor dielectric layer 220 may conformally cover the plurality of lower electrodes 210. The upper electrode 230 may cover the capacitor dielectric layer 220. The upper electrode 230 may face the lower electrode 210 with the capacitor dielectric layer 220 therebetween. Each of the capacitor dielectric layer 220 and the upper electrode 230 may be formed in one body to cover the plurality of lower electrodes 210 together, in a certain area.

In some embodiments, each of the plurality of lower electrodes 210 may have a pillar shape, in which the inside thereof is filled to have a circular horizontal cross-section. In other embodiments, each of the plurality of lower electrodes 210 may have a cylinder shape having a closed lower portion thereof. In addition, the plurality of lower electrodes 210 may be arranged in a honeycomb shape arranged in a zigzag manner with respect to the first horizontal direction (X direction) or the second horizontal direction (Y direction). Alternatively, the plurality of lower electrodes 210 may be arranged in a matrix form, in which the plurality of lower electrodes 210 are arranged in a line in each of the first horizontal direction (X direction) and the second horizontal direction (Y direction). The plurality of lower electrodes 210 may include, e.g., silicon doped with impurities, a metal, e.g., tungsten and copper, or a conductive metal compound, e.g., titanium nitride. Although not illustrated, at least one support pattern in contact with sidewalls of the plurality of lower electrodes 210 may be further included.

The capacitor dielectric layer 220 may include, e.g., TaO, TaAlO, TaON, AlO, AlSiO, HfO, HfSiO, ZrO, ZrSiO, TiO, TiAlO, (Ba,Sr)TiO (BST), SrTiO (STO), BaTiO (BTO), Pb(Zr,Ti)O (PZT), (Pb,La)(Zr,Ti)O, Ba(Zr,Ti)O, Sr(Zr,Ti)O, or a combination thereof. The upper electrode 230 may include, e.g., doped silicon, Ru, RuO, Pt, PtO, Ir, IrO, SrRuO (SRO), (Ba,Sr)RuO (BSRO), CaRuO (CRO), BaRuO, La(Sr,Co)O, Ti, TiN, W, WN, Ta, TaN, TiAlN, TiSiN, TaAlN, TaSiN, or a combination thereof.

By using the above-described manufacturing method, the integrated circuit device 10 may be manufactured. By planarizing the upper portion of the bit line structure 140, the uppermost surface of the insulation capping pattern 148 is coplanar with the uppermost surface of the barrier conductive layer 192, and the plurality of landing pads 194 with a regular conductive pattern having improved steps may be formed, thereby forming the integrated circuit device 10 with secure production efficiency and stable operation performance.

Figure 14:
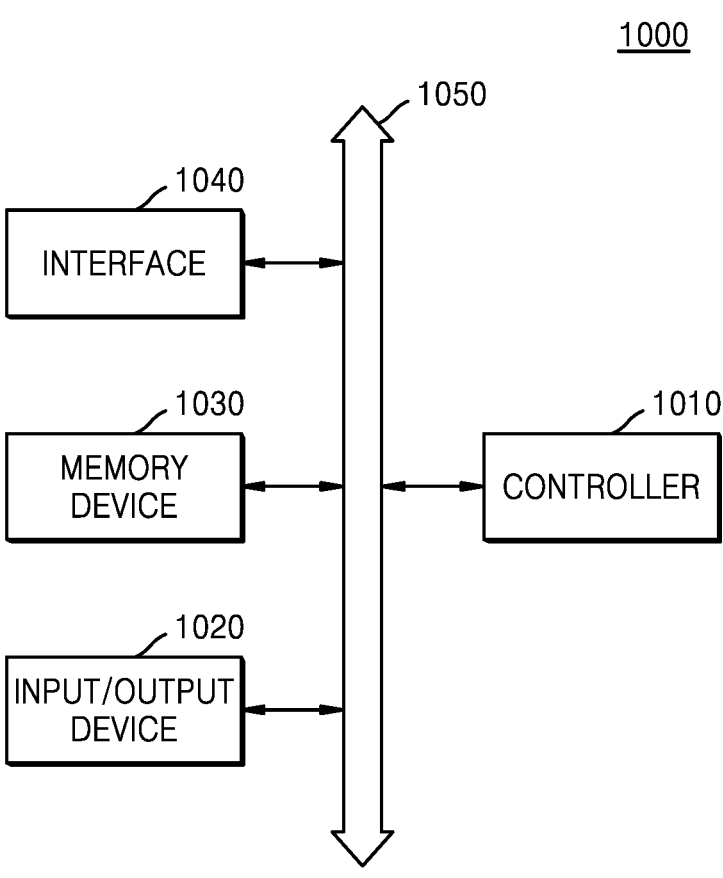
FIG. 14 is a configuration diagram of a system including an integrated circuit device, according to an embodiment.

FIG. 14 is a configuration diagram of a system 1000 including an integrated circuit device, according to an embodiment.

Referring to FIG. 14, the system 1000 may include a controller 1010, an input/output (I/O) device 1020, a memory device 1030, an interface 1040, and a bus 1050. The system 1000 may include, e.g., a mobile system or a system transceiving information. In some embodiments, the mobile system may include, e.g., a portable computer, a web tablet, a mobile phone, a digital music player, or a memory card.

The controller 1010 may be used for controlling execution programs in the system 1000, and may include, e.g., a micro-processor, a digital signal processor, a micro-controller, or a similar device.

The I/o device 1020 may be used to input or output data of the system 1000. The system 1000 may be connected to an external device, e.g., a personal computer or a network, by using the I/O device 1020, and may exchange data with the external device. The I/O device 1020 may include, e.g., a touch screen, a touch pad, a keyboard, or a display.

The memory device 1030 may store data for an operation of the controller 1010, or may store data processed by the controller 1010. The memory device 1030 may include the integrated circuit device 10 described above.

The interface 1040 may be a data transmission path between the system 1000 and an external device. The controller 1010, the I/O device 1020, the memory device 1030, and the interface 1040 may communicate with each other via the bus 1050.

By way of summation and review, embodiments provide an integrated circuit device capable of securing production efficiency and stable operation performance, by forming a plurality of landing pads by using regular conductive patterns having improved steps.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated.

Accordingly, it will be understood by those of skill in the art that various changes in form and details may be made without departing from the spirit and scope of the present invention as set forth in the following claims.

What is claimed is:

1. An integrated circuit device, comprising:
a substrate having an active area;
bit line structures on the substrate, each of the bit line structures including a bit line and an insulation capping pattern on the bit line:
an insulating spacer on each sidewall of the bit line structures;
a buried contact between the bit line structures, the buried contact being connected to the active area;
a barrier conductive layer on side surfaces of the insulation capping pattern, an upper surface of the insulating spacer, and side surfaces of the insulating spacer; and
a landing pad electrically connected to the buried contact, the landing pad vertically overlapping one of the bit line structures on the insulation capping pattern and the barrier conductive layer and contacting an uppermost surface of the insulation capping pattern,
wherein the uppermost surface of the insulation capping pattern is coplanar with an uppermost surface of the barrier conductive layer.

2. The integrated circuit device as claimed in claim 1, wherein the landing pad contacts the uppermost surface of the barrier conductive layer.

3. The integrated circuit device as claimed in claim 2, wherein the uppermost surface of the insulation capping pattern and the uppermost surface of the barrier conductive layer define a flat surface.

4. The integrated circuit device as claimed in claim 1, wherein the uppermost surface of the insulation capping pattern is at a vertical level higher than a vertical level of an uppermost surface of the insulating spacer.

5. The integrated circuit device as claimed in claim 4, wherein the landing pad is in a cavity defined by the barrier conductive layer, and
wherein the landing pad does not contact the insulating spacer.

6. The integrated circuit device as claimed in claim 5, wherein the upper surface of the insulating spacer vertically overlaps the landing pad and is surrounded by the barrier conductive layer.

7. The integrated circuit device as claimed in claim 1, further comprising a node separation pattern contacting a first side surface of the insulation capping pattern, the node separation pattern contacting the upper surface of the insulating spacer on the first side surface of the insulation capping pattern.

8. The integrated circuit device as claimed in claim 7, wherein the node separation pattern is in contact with the landing pad and the barrier conductive layer.

9. The integrated circuit device as claimed in claim 7, wherein a vertical level of a lowermost surface of the node separation pattern is lower than a vertical level of an uppermost surface of the insulating spacer.

10. The integrated circuit device as claimed in claim 1, wherein the insulating spacer includes:
an inside spacer contacting each of the bit line structures; and
an outside spacer between the inside spacer and the barrier conductive layer.

11. An integrated circuit device, comprising:
a substrate including a cell area and a core/periphery area;

bit line structures on the cell area, each of the bit line structures including a bit line and an insulation capping pattern on the bit line;
an insulating spacer on each sidewall of the bit line structures;
a buried contact between the bit line structures;
a barrier conductive layer on side surfaces of the insulation capping pattern, an upper surface of the insulating spacer, and side surfaces of the insulating spacer;
a landing pad electrically connected to the buried contact, the landing pad vertically overlapping one of the bit line structures on the insulation capping pattern and the barrier conductive layer and contacting an uppermost surface of the insulation capping pattern; and
a core structure on the core/periphery area, the core structure including a barrier metal layer on sidewalls thereof,
wherein the uppermost surface of the insulation capping pattern is coplanar with an uppermost surface of the barrier conductive layer, and
wherein an uppermost surface of the core structure is coplanar with the uppermost surface of the barrier metal layer.

12. The integrated circuit device as claimed in claim 11, wherein, on an interface surface between the cell area and the core/periphery area, the uppermost surface of the insulation capping pattern is coplanar with the uppermost surface of the core structure.

13. The integrated circuit device as claimed in claim 11, wherein, in the cell area, an uppermost surface of the landing pad is coplanar with an uppermost surface of a conductive material layer including an identical material to a material of the landing pad in the core/periphery area.

14. The integrated circuit device as claimed in claim 11, wherein the landing pad does not contact the insulating spacer.

15. The integrated circuit device as claimed in claim 11, wherein the cell area includes an active area defined by a device isolation area, and
wherein the buried contact is connected to the active area.

16. An integrated circuit device, comprising:
a substrate having an active area defined by a device isolation area;
a pair of bit line structures on the substrate, each bit line structure of the pair of bit line structures including a bit line and an insulation capping pattern on the bit line;
an insulating spacer on sidewalls of each of the pair of bit line structures;
a buried contact between the pair of bit line structures, the buried contact being connected to the active area;
a barrier conductive layer on side surfaces of the insulation capping pattern, an upper surface of the insulating spacer, and side surfaces of the insulating spacer;
a landing pad electrically connected to the buried contact, the landing pad vertically overlapping a first of the pair of bit line structures on the insulation capping pattern and the barrier conductive layer and contacting an uppermost surface of the insulation capping pattern;
a node separation pattern contacting a first side surface of the insulation capping pattern of a second of the pair of bit line structures, the node separation pattern contacting the upper surface of the insulating spacer on the first side surface of the insulation capping pattern; and
a capacitor structure on an upper surface of the landing pad, the capacitor structure including a capacitor lower electrode electrically connected to the landing pad wherein the uppermost surface of the insulation capping pattern is coplanar with an uppermost surface of the barrier conductive layer.

17. The integrated circuit device as claimed in claim 16, wherein:

the node separation pattern is in contact with the landing pad and the barrier conductive layer, and a vertical level of a lowermost surface of the node separation pattern is lower than a vertical level of an uppermost surface of the insulating spacer.

18. The integrated circuit device as claimed in claim 16, wherein the uppermost surface of the insulation capping pattern is at a vertical level higher than a vertical level of an uppermost surface of the insulating spacer.

19. The integrated circuit device as claimed in claim 16, wherein:

the upper surface of the insulating spacer vertically overlapping the landing pad is surrounded by the barrier conductive layer, and the upper surface of the insulating spacer not vertically overlapping the landing pad is surrounded by the node separation pattern.

20. The integrated circuit device as claimed in claim 16, wherein:

the insulating spacer includes spacer layers, and an outermost surface of each of the spacer layers is in contact with the barrier conductive layer.

\* \* \* \* \*